(12) United States Patent
Maeta

(10) Patent No.: US 11,012,008 B2
(45) Date of Patent: May 18, 2021

(54) ELECTROSTATIC CHUCK DEVICE

(71) Applicant: SUMITOMO OSAKA CEMENT CO., LTD., Tokyo (JP)

(72) Inventor: Shinichi Maeta, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 0 days.

(21) Appl. No.: 16/954,989

(22) PCT Filed: Nov. 11, 2019

(86) PCT No.: PCT/JP2019/044090
§ 371 (c)(1),
(2) Date: Jun. 17, 2020

(87) PCT Pub. No.: WO2020/170514
PCT Pub. Date: Aug. 27, 2020

(65) Prior Publication Data
US 2021/0006182 A1 Jan. 7, 2021

(30) Foreign Application Priority Data

Feb. 20, 2019 (JP) .................................. 2019-028054
Feb. 20, 2019 (JP) .................................. 2019-028628

(51) Int. Cl.
*H02N 13/00* (2006.01)
*H01L 21/683* (2006.01)

(52) U.S. Cl.
CPC ......... *H02N 13/00* (2013.01); *H01L 21/6833* (2013.01)

(58) Field of Classification Search
CPC ........ B08B 15/00; B23K 10/00; B23K 10/02; B23K 37/0461; B23Q 3/15; B32B 7/12;
(Continued)

(56) References Cited

U.S. PATENT DOCUMENTS 7,586,734 B2 * 9/2009 Kamitani ............ H01L 21/6831
361/230
7,646,581 B2 * 1/2010 Sasaki ................. C23C 16/4581
361/234
(Continued)

FOREIGN PATENT DOCUMENTS

JP          3732060 B2 *  1/2006
JP       2009-060035 A    3/2009
(Continued)

OTHER PUBLICATIONS

International Search Report for PCT/JP2019/044090 (dated Feb. 4, 2020).
(Continued)

*Primary Examiner* — Jared Fureman
*Assistant Examiner* — Nicolas Bellido
(74) *Attorney, Agent, or Firm* — Merchant & Gould P.C.

(57) ABSTRACT

According to an electrostatic chuck device of the present invention, a cross-sectional shape of a base body in a thickness direction is a convex curved surface or a concave curved surface that gradually curves from a center of one main surface toward an outer periphery of the one main surface, an annular projection portion is provided on a peripheral portion on the one main surface of the base body so as to go around the peripheral portion, a plurality of convex projection portions are provided in a region surrounded by the annular projection portion, the convex projection portion has the top surface in contact with the plate-shaped sample, a side surface, and an R surface continuously connecting the top surface and the side surface.

13 Claims, 9 Drawing Sheets

(58) Field of Classification Search
CPC ........... C08K 2003/2227; C09D 183/04; C09J 183/04; C23C 16/4586; C23F 1/00; G01K 2217/00; G01K 3/005; G01K 7/01; G03F 7/707; G03F 7/70708; H01J 2237/002; H01J 2237/2001; H01J 2237/2007; H01J 2237/334; H01J 2237/3344; H01J 37/32082; H01J 37/32091; H01J 37/32477; H01J 37/32513; H01J 37/32642; H01J 37/32697; H01J 37/32715; H01J 37/32724; H01J 37/32908; H01L 21/00; H01L 21/3065; H01L 21/31116; H01L 21/67069; H01L 21/67098; H01L 21/67103; H01L 21/67109; H01L 21/67248; H01L 21/67288; H01L 21/67333; H01L 21/67336; H01L 21/683; H01L 21/6831; H01L 21/6833; H01L 21/6836; H01L 21/687; H01L 21/68721; H01L 21/68735; H01L 21/6875; H01L 21/68757; H01L 21/68785; H01L 23/34; H01L 27/0266; H01L 27/0629; H01L 28/20; H01L 29/16; H01L 29/2003; H01L 29/778; H01L 29/78; H01L 29/808; H02H 1/0007; H02H 3/08; H02H 5/044; H02N 13/00; H03K 17/0822; H03K 17/18; H03K 2017/0806; H03K 2217/0027; H05B 7/185; H05H 1/34; H05H 1/48; Y10T 156/10; Y10T 428/2848
See application file for complete search history.

(56) References Cited

U.S. PATENT DOCUMENTS

| | | | | |
|---|---|---|---|---|
| 9,466,518 | B2* | 10/2016 | Maeta | H01L 21/6831 |
| 10,068,790 | B2* | 9/2018 | Kouno | H01L 21/67103 |
| 10,153,192 | B2* | 12/2018 | Maeta | H01L 21/6833 |
| 10,256,131 | B2* | 4/2019 | Kosakai | B23Q 3/15 |
| 10,389,278 | B2* | 8/2019 | Moriya | H02N 13/00 |
| 2006/0011610 | A1* | 1/2006 | Kondou | H01L 21/67103 |
| | | | | 219/444.1 |
| 2006/0209490 | A1* | 9/2006 | Nakamura | H01L 21/6831 |
| | | | | 361/234 |
| 2009/0056112 | A1 | 3/2009 | Kobayashi | |
| 2017/0345702 | A1* | 11/2017 | Iwabuchi | H01L 21/6838 |
| 2019/0067069 | A1* | 2/2019 | Glasko | H01L 21/6833 |
| 2019/0115244 | A1* | 4/2019 | Inoue | H01L 21/683 |

FOREIGN PATENT DOCUMENTS

| | | |
|---|---|---|
| JP | 2010-016176 A | 1/2010 |
| JP | 2014-027207 A | 2/2014 |
| JP | 2016-139650 A | 8/2016 |
| JP | 6119430 B | 4/2017 |
| JP | 6168162 B | 7/2017 |

OTHER PUBLICATIONS

Notice of Allowance for Japanese Patent Application No. 2020-515275 (dated Apr. 7, 2020).

* cited by examiner

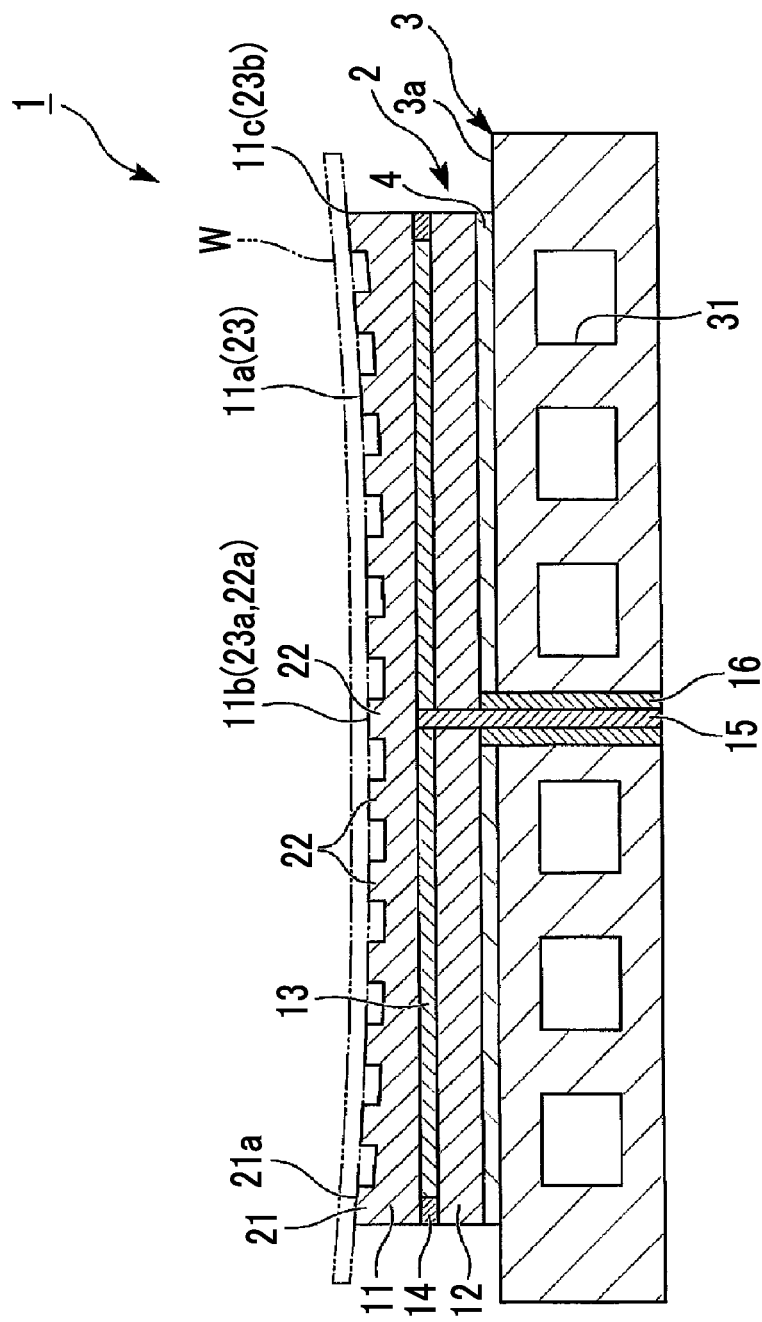

ELECTROSTATIC CHUCK DEVICE

TECHNICAL FIELD

The present invention relates to an electrostatic chuck device.

The present application is a U.S. National Stage Application under 35 U.S.C. 071 of International Patent Application No. PCT/JP2019/044090, filed on Nov. 11, 2019, which claims priority to Japanese Patent Application No. 2019-028054 filed on Feb. 20, 2019, and Japanese Patent Application No. 2019-028628 filed on Feb. 20, 2019, the disclosures of all of which are hereby incorporated by reference in their entireties.

BACKGROUND

In the related art, in a step of manufacturing a semiconductor device, a liquid crystal device, or the like, various types of treatment are performed on a surface of a plate-shaped sample such as a semiconductor wafer, a metal wafer, and a glass substrate. In a case of performing various types of treatment, an electrostatic chuck device is used to fix the plate-shaped sample by electrostatic attraction force and maintain the plate-shaped sample at a preferable constant temperature.

The electrostatic chuck device is a device having an electrostatic chuck portion in which an internal electrode for electrostatic attraction is provided inside a ceramic plate-shaped body as a dielectric or on a lower surface thereof, as an essential component. In addition, the electrostatic chuck device places a plate-shaped sample such as a semiconductor wafer, a metal wafer, a glass substrate, and the like on a surface (placement surface) of the ceramic plate-shaped body and applies a voltage between the plate-shaped sample and an internal electrode for electrostatic attraction to generate electrostatic attraction force, and as a result, the plate-shaped sample is attracted and fixed to an attraction surface of the ceramic plate-shaped body by the electrostatic attraction force.

In such an electrostatic chuck device, there is an apparatus in which an inert gas such as helium is flowed between an attraction surface of a ceramic plate-shaped body and a plate-shaped sample to cool the plate-shaped sample in order to control the temperature of the plate-shaped sample during processing or treatment. In such an electrostatic chuck device, various improvements have been executed to remedy various characteristics such as a sealing characteristic of an inert gas and a desorption characteristic of a plate-shaped sample such as a wafer.

For example, known is an electrostatic chuck device in which an annular projection portion is provided on a peripheral portion of one main surface (placement surface) of a base body, a plurality of projection portions having the same height as the annular projection portion are provided in a region surrounded by the annular projection portion on the one main surface, an upper end surface of the annular projection portion and upper surfaces of the plurality of projection portions are positioned on a concave surface whose bottom surface is a center portion of the one main surface. Thereby, in a case where the plate-shaped sample is attracted or desorbed, the plate-shaped sample is not deformed, the temperature of the plate-shaped sample also becomes uniform, and particles are hardly generated (for example, see Patent Literatures Nos. 1 and 2).

CITATION LIST

Patent Literature

[Patent Literature No. 1] Japanese Patent No. 6119430
[Patent Literature No. 2] Japanese Patent No. 6168162

SUMMARY OF INVENTION

Technical Problem

However, as in the electrostatic chuck device of Patent Literature No. 1, in a case where one main surface of the base body on which the plate-shaped sample is placed is formed with the concave surface, there is a problem that the projection portion positioned on the outer peripheral portion of the one main surface on the base body has a greater amount of wear caused by coming into contact with the plate-shaped sample than the projection portions positioned on an inner peripheral portion of the one main surface of the base body. In addition, in a case where a shape of a top surface of the projection portion is square as in the electrostatic chuck device of Patent Literature No. 1, a corner of the projection portion is worn by coming into contact with the plate-shaped sample, and thus there is a problem that a contact area with the plate-shaped sample is changed.

Furthermore, in a case where a shape of a top surface of the projection portion is an arc shape as in the electrostatic chuck device of Patent Literature No. 2, there is a problem that the top surface of the projection portion is easily worn by coming into contact with the plate-shaped sample.

The present invention has been made in order to solve the above described problems, and an object thereof is to provide an electrostatic chuck device. The electrostatic chuck device has a small change in temperature uniformity of a plate-shaped sample attracted to a placement surface of a base body and in-plane temperature uniformity of the plate-shaped sample over time when the long-term use since an amount of change in a contact area between the projection portion and the plate-shaped sample is small even though the projection portion is worn, by controlling a shape of a projection portion for attracting the plate-shaped sample on the placement surface of the base body.

Solution to Problem

The present inventors have conducted intensive studies in order to solve the above problems, and as a result, have found to solve the above problems by an electrostatic chuck device for electrostatically attracting a plate-shaped sample to one main surface of a base body, in which a difference between a height of a top surface of a convex projection portion positioned at a center of the one main surface and a height of an upper surface of the annular projection portion is 1 μm or higher and 30 μm or lower, the convex projection portion has the top surface coming into contact with the plate-shaped sample, a side surface, and an R surface (chamfered portion) continuously connecting the top surface and the side surface, and a ratio of a diameter of the top surface to a diameter of a bottom surface is 0.75 or higher, and an angle formed by the top surface and the side surface of the convex projection portion is 90° or higher and 160° or lower.

The electrostatic chuck device of the present invention has the following aspects.

[1] An electrostatic chuck device for electrostatically attracting a plate-shaped sample to one main surface of a base body thereof, in which a cross-sectional shape of the base body in a thickness direction is a convex curved surface or a concave curved surface that gradually curves from a center of the one main surface toward an outer periphery of the one main surface, an annular projection portion having a substantially square vertical cross-section is provided on a peripheral portion on the one main surface so as to go around the peripheral portion, a plurality of convex projection portions having a circular transverse cross-section or a polygonal transverse cross-section and a substantially square vertical cross-section are provided in a region surrounded by the annular projection portion on the one main surface, a difference between a height of a top surface of the convex projection portion positioned at a center of the one main surface and a height of an upper surface of the annular projection portion is 1 μm or higher and 30 μm or lower, the convex projection portion has the top surface coming into contact with the plate-shaped sample, a side surface, and an R surface continuously connecting the top surface and the side surface, and a ratio of a diameter of the top surface to a diameter of a bottom surface of the portion is 0.75 or higher, and an angle formed by the top surface and the side surface of the convex projection portion is 90° or higher and 160° or lower.

[2] The electrostatic chuck device according to [1], in which a center line average surface roughness Ra of the top surface of the convex projection portion is 0.05 μm or lower.

[3] The electrostatic chuck device according to [1] or [2], in which a center line average surface roughness Ra of the upper surface of the annular projection portion is 0.05 μm or lower.

[4] The electrostatic chuck device according to any one of [1] to [3], in which the diameter of the top surface of the convex projection portion is 100 μm or higher and 1000 μm or lower.

[5] The electrostatic chuck device according to any one of [1] to [4], in which the cross-sectional shape of the base body in the thickness direction is the convex curved surface that gradually curves from the center of the one main surface toward the outer periphery of the one main surface, and a ratio of a diameter of the top surface of the convex projection portion positioned on an inner peripheral portion on the one main surface to a diameter of the bottom surface thereof is greater than a ratio of a diameter of the top surface of the convex projection portion positioned on an outer peripheral portion on the one main surface to a diameter of a bottom surface thereof.

[6] The electrostatic chuck device according to [5], in which a ratio A1 of a total contact area between the convex projection portions positioned on the inner peripheral portion and the plate-shaped sample to a total area of the inner peripheral portion is greater than a ratio B1 of a total contact area between the convex projection portion positioned on the outer peripheral portion and the plate-shaped sample to a total area of the outer peripheral portion.

[7] The electrostatic chuck device according to [6], in which an intermediate portion is provided between the outer peripheral portion and the inner peripheral portion, and a diameter of a bottom surface of the convex projection portion positioned on the intermediate portion is greater than a diameter of the bottom surface of the convex projection portion positioned on the outer peripheral portion and smaller than a diameter of the bottom surface of the convex projection portion positioned on the inner peripheral portion.

[8] The electrostatic chuck device according to [6] or [7], in which the ratio A1, the ratio B1, and a ratio C1 of a total contact area of the convex projection portions positioned on the intermediate portion and the plate-shaped sample to a total area of the intermediate portion satisfy the following Expression (1).

$$A1 > C1 > B1 \quad (1)$$

[9] The electrostatic chuck device according to any one of [1] to [4], in which the cross-sectional shape of the base body in a thickness direction is the concave curved surface that gradually curves from a center of the one main surface toward the outer periphery of the one main surface, and a ratio of a diameter of the top surface of the convex projection portion positioned on an outer peripheral portion on the one main surface to a diameter of the bottom surface thereof is greater than a ratio of a diameter of the top surface of the convex projection portion positioned on an inner peripheral portion on the one main surface to a diameter of the bottom surface thereof.

[10] The electrostatic chuck device according to [9], in which a total B22 of a contact area between the convex projection portions positioned on the outer peripheral portion and the plate-shaped sample is greater than a total A22 of a contact area between the convex projection portion positioned on the inner peripheral portion and the plate-shaped sample.

[11] The electrostatic chuck device according to [10], in which an intermediate portion is provided between the outer peripheral portion and the inner peripheral portion, and a diameter of the bottom surface of the convex projection portion positioned on the intermediate portion is greater than a diameter of the bottom surface of the convex projection portion positioned on the inner peripheral portion and smaller than a diameter of the bottom surface of the convex projection portion positioned on the outer peripheral portion.

[12] The electrostatic chuck device according to [10] or [11], in which the total A22, the total B22, and a total C22 of a contact area between the convex projection portions positioned on the intermediate portion and the plate-shaped sample satisfy the following Expression (2).

$$B22 > C22 > A22 \quad (2)$$

[13] The electrostatic chuck device according to any one of [1] to [12], in which the one main surface is made of an aluminum oxide-silicon carbide composite sintered compact, an aluminum oxide sintered compact, an aluminum nitride sintered compact, or an yttrium oxide sintered compact.

[14] The electrostatic chuck device according to [6], in which a ratio (A1/B1) of the ratio A1 to the ratio B1 is preferably 1.5 to 10.0, more preferably 2.0 to 9.0, still more preferably 2.8 to 8.0, and particularly preferably 3.0 to 7.0.

[15] The electrostatic chuck device according to [8], in which a ratio (C1/B1) of the ratio C1 to the ratio B1 is preferably 1.25 to 5.0, more preferably 1.5 to 4.5, still more preferably 2.0 to 4.0, and particularly preferably 2.5 to 3.5.

[16] The electrostatic chuck device according to [8] or [15], in which a ratio (A1/C1) of the ratio A1 to the ratio C1 is preferably 1.25 to 5.0, more preferably 1.5 to 4.5, still more preferably 2.0 to 4.0, and particularly preferably 2.5 to 3.5.

[17] The electrostatic chuck device according to [10], in which a ratio (B22/A22) of the total B22 to the total A22 is preferably 1.5 to 10.0, more preferably 2.0 to 9.0, still more preferably 2.8 to 8.0, and particularly preferably 3.0 to 7.0.

[18] The electrostatic chuck device according to [12], in which a ratio (B22/C22) of the total B22 to the total C22 is preferably 1.25 to 5.0, more preferably 1.5 to 4.5, still more preferably 2.0 to 4.0, and particularly preferably 2.5 to 3.5.

[19] The electrostatic chuck device according to [12] or [18], in which a ratio (C22/A22) of the total C22 to the total A22 (C22/A22) is preferably 1.25 to 5.0, more preferably 1.5 to 4.5, still more preferably 2.0 to 4.0, and particularly preferably 2.5 to 3.5.

Advantageous Effects of Invention

According to the electrostatic chuck device of the present invention, since a change in a contact area with the plate-shaped sample W is small even though a projection portion for attracting the plate-shaped sample on the placement surface of the base body is worn, the electrostatic chuck device that has excellent temperature uniformity of a plate-shaped sample attracted to a placement surface of a base body can be provided.

BRIEF DESCRIPTION OF DRAWINGS

FIG. 1B is a cross-sectional view showing an electrostatic chuck device according to an embodiment of the present invention.

DESCRIPTION OF EMBODIMENTS

Embodiments of an electrostatic chuck device according to the present invention will be described.

The present embodiments are specifically described for better understanding of the gist of the invention, and the present invention is not limited unless otherwise specified.

Omissions, additions, substitutions, and other modifications can be made to numbers, positions, sizes, ratios, members, and the like without departing from the spirit of the present invention.

<Electrostatic Chuck Device>

Figure 1A:
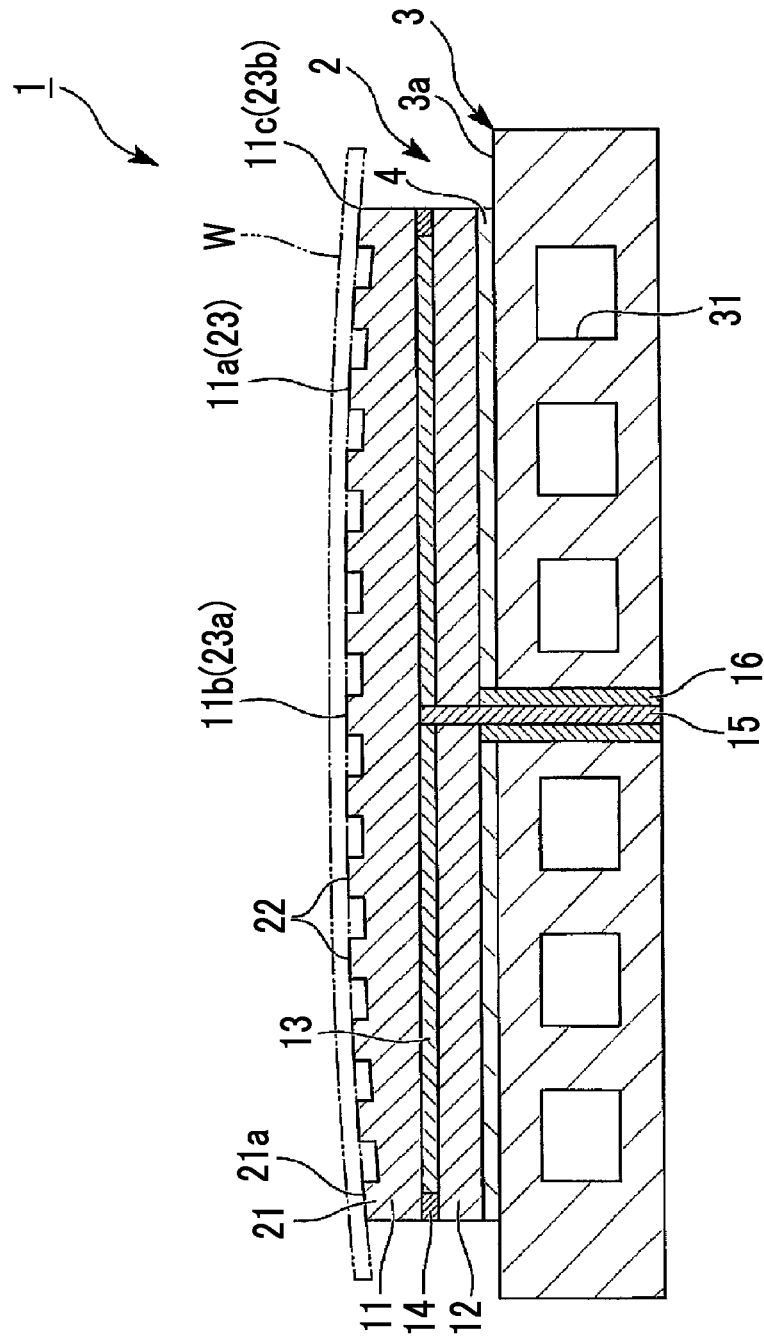
FIG. 1A is a cross-sectional view showing an electrostatic chuck device according to an embodiment of the present invention.
Figure 2:
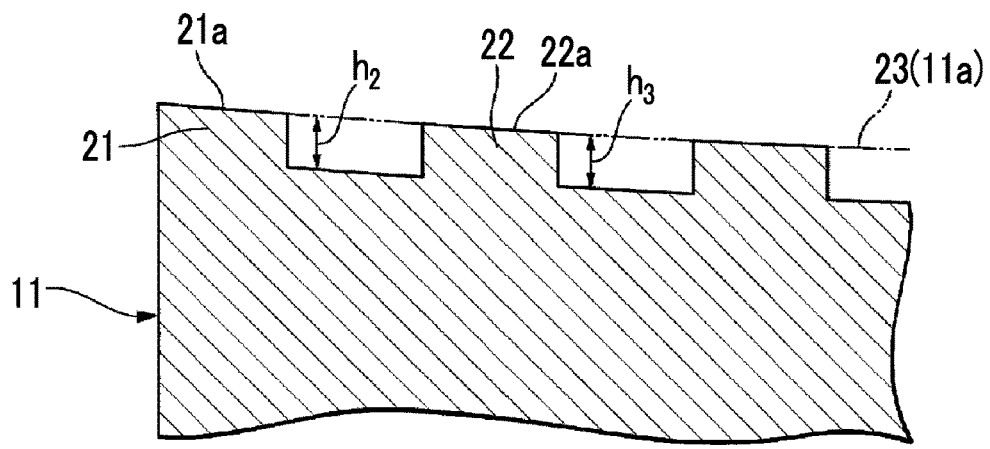
FIG. 2 is a partially enlarged cross-sectional view showing a vicinity of a peripheral portion of an electrostatic chuck portion of an electrostatic chuck device according to an embodiment of the present invention.
Figure 3:
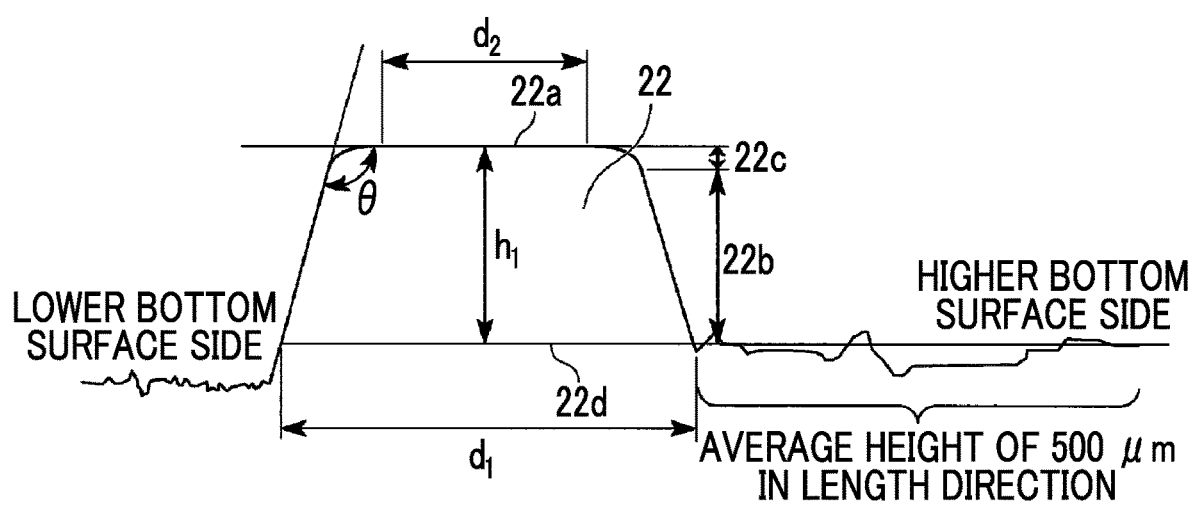
FIG. 3 is a partially enlarged cross-sectional view showing a convex projection portion of an electrostatic chuck portion of an electrostatic chuck device according to an embodiment of the present invention.

FIG. 1A is a cross-sectional view showing an electrostatic chuck device according to the present embodiment. FIG. 1B is a cross-sectional view showing an electrostatic chuck device according to the present embodiment. FIG. 2 is a partially enlarged cross-sectional view showing a vicinity of a peripheral portion of an electrostatic chuck portion of an electrostatic chuck device according to the present embodiment. FIG. 3 is a partially enlarged cross-sectional view showing a convex projection portion of an electrostatic chuck portion of an electrostatic chuck device according to the present embodiment.

As shown in FIGS. 1A and 1B, an electrostatic chuck device 1 of the present embodiment includes a disk-shaped electrostatic chuck portion 2, a disk-shaped cooling base portion 3 having a thickness for cooling the electrostatic chuck portion 2 to a desired temperature, and an adhesive layer 4 for bonding and integrating the electrostatic chuck portion 2 with the cooling base portion 3.

[Electrostatic Chuck Portion]

The electrostatic chuck portion 2 includes a placement plate (base body) 11, a supporting plate 12, an internal electrode for electrostatic attraction 13, an insulating material layer 14, and a power supply terminal 15.

The placement plate (base body) 11 has an upper surface (one main surface) as a placement surface 11a on which a plate-shaped sample W such as a semiconductor wafer is placed.

The supporting plate 12 is a member for supporting the placement plate 11.

The internal electrode for electrostatic attraction 13 is provided between the placement plate 11 and the supporting plate 12.

The insulating material layer 14 is provided between the placement plate 11 and the supporting plate 12 and is a layer for insulating the periphery of the internal electrode for electrostatic attraction 13.

The power supply terminal 15 is a terminal for applying a direct-current voltage to the internal electrode for electrostatic attraction 13.

An annular projection portion 21 having a square cross-section is provided on a peripheral portion on the placement surface 11a of the placement plate 11 so as to go around the peripheral portion. A plurality of convex projection portions 22 having a circular cross-section and a substantially rectangular longitudinal cross-section are provided in a region surrounded by the annular projection portion 21 on the placement surface 11a of the placement plate 11. As shown in FIG. 2, an upper surface 21a of the annular projection portion 21 and a top surface 22a of each of the plurality of convex projection portions 22 are positioned on a convex surface or concave surface 23 whose bottom surface is positioned on a center 11b of the placement surface 11a.

As shown in FIGS. 1A and 1B, a cross-sectional shape of the placement plate 11 in a thickness direction includes a convex surface or concave surface 23 having a curved shape that gradually curves from the center 11b of the placement surface 11a toward an outer periphery 11c of the placement surface 11a. Specifically, the cross-sectional shape of the placement plate 11 in the thickness direction includes the convex surface or concave surface 23 having the curved shape to curve in such a manner that a height with reference to an upper surface 3a (one main surface) of a cooling base portion 3, that is, a height from the upper surface 3a is gradually increased or decreased from the center 11b of the placement surface 11a (a center 23a of the convex surface or concave surface 23) toward the outer periphery 11c of the placement surface 11a (an outer periphery 23b of the convex surface or concave surface 23). That is, the placement surface 11a forms the convex surface or concave surface 23. As shown in FIG. 2, an upper surface 21a of the annular projection portion 21 and a top surface 22a of each of the plurality of convex projection portions 22 are positioned on a convex surface or concave surface 23 whose bottom surface is positioned on a center 11b of the placement surface 11a. That is, the upper surface 21a and the top surface 22a form a part of the convex surface or concave surface 23.

A difference between a height of the top surface 22a of the convex projection portion 22 positioned at the center 11b of the placement surface 11a (the center 23a of the convex surface or concave surface 23) (a height with reference to the upper surface (one main surface) 3a of the cooling base portion 3) and a height of the upper surface 21a of the annular projection portion 21 (a height with reference to the upper surface (one main surface) 3a of the cooling base portion 3) is 1 µm or higher and 30 µm or lower, and preferably 5 µm or higher and 15 µm or lower. As necessary, the height of the top surface 22a may be higher than the upper surface 21a, and the height of the upper surface 21a may be higher than the top surface 22a.

In a case where the difference between the height of the top surface 22a of the convex projection portion 22 positioned at a center of the center 11b of the placement surface 11a and the height of the upper surface 21a of the annular projection portion 21 is lower than 1 µm and the placement plate 11 is fixed to the cooling base portion 3, the placement plate 11 may be a convex shape. On the other hand, in a case where the difference between the height of the top surface 22a of the convex projection portion 22 positioned at a center of the center 11b of the placement surface 11a and the height of the upper surface 21a of the annular projection portion 21 is higher than 30 µm, a gap is generated between the plate-shaped sample W and the placement surface 11a of the placement plate 11 when the plate-shaped sample W is attracted, and as a result, ability to uniformize the temperature of the plate-shaped sample W may be reduced.

The difference between the height of the top surface 22a of the convex projection portion 22 positioned at center of the center 11b of the placement surface 11a and the height of the upper surface 21a of the annular projection portion 21 can be measured using a three-dimensional measuring machine (trade name: ZYZAX SVA NEX 9/6/6-C2, manufactured by TOKYO SEIMITSU CO., LTD.).

As shown in FIG. 3, the convex projection portion 22 has a top surface 22a in contact with the plate-shaped sample W, a side surface 22b, and an R surface 22c continuously connecting the top surface 22a and the side surface 22b.

The top surface 22a of the convex projection portion 22 is a surface within 0.4 µm from a maximum height (the top) with reference to a bottom surface 22d of the convex projection portion 22 described later downward in the thickness direction of the cooling base portion 3. Here, the reason why the top surface 22a of the convex projection portion 22 is defined in this manner is as follows. When the plate-shaped sample W is attracted to the placement surface 11a, the plate-shaped sample W is deformed to follow a shape of the convex projection portion 22. A deformation amount of the plate-shaped sample W is about 0.4 µm downward in the thickness direction of the cooling base portion 3.

The side surface 22b of the convex projection portion 22 is a surface substantially along a height $h_1$ of the convex projection portion 22 (a distance from the bottom surface 22d to the top surface 22a of the convex projection portion 22) and having 10% or more and 90% or less of the height $h_1$ of the convex projection portion 22. That is, in a case where the bottom surface 22d is set to a reference surface (0) of the height $h_1$, the side surface has a height of 0.1 $h_1$ to 0.9 $h_1$ from the bottom surface 22d. As necessary, the side surface having a height of 0.2 $h_1$ to 0.8 $h_1$ or a height of 0.4 $h_1$ to 0.6 $h_1$ may be positioned.

The R surface 22c of the convex projection portion 22 is a surface continuously connecting the top surface 22a and the side surface 22b, and having a radius of curvature of 10 µm or higher and 50 µm or lower. In a case where the radius of curvature of the R surface 22c of the convex projection portion 22 is within the above range, an area coming into contact with the plate-shaped sample W is small even though the top surface 22a of the convex projection portion 22 is worn. Therefore, the temperature uniformity of the plate-shaped sample W does not change, even in the long-term use.

The shape of the convex projection portion 22 can be measured using a surface roughness and contour complex measuring instrument (trade name: SURFCOM NEX, manufactured by TOKYO SEIMITSU CO., LTD.) to scan through a center of the top surface 22a of the convex projection portion 22 from the center 11b of the placement surface 11a to an outer peripheral direction, and thus the shape can be measured.

Accordingly, information on the top surface 22a, the side surface 22b, the R surface 22c, the bottom surface 22d, and an angle θ formed by the top surface 22a and the side surface 22b of the convex projection portion 22 can be obtained.

Furthermore, since the top surface 22a of the convex projection portion 22 is scanned through the center thereof, information on a diameter $d_2$ of the top surface 22a of the convex projection portion 22 can also be obtained.

The bottom surface 22d of the convex projection portion 22 forms the base when the convex projection portion 22 is viewed from the cross-section. The bottom surface 22d of the convex projection portion 22 can be determined as follows. First, a concave portion between the convex projection portions 22 is measured. An average height of 500 µm of the bottom surface (concave portion) of the convex projection portion 22 in a length direction is calculated. Furthermore, a height of the concave portion in a central portion direction is compared to a height of the concave portion in an outer peripheral portion direction, and the higher one is adopted as a bottom surface position (height).

From the above analysis, a diameter $d_1$ of the bottom surface 22d of the convex projection portion 22 is calculated.

A ratio of the diameter $d_2$ of the top surface 22a of the convex projection portion 22 to the diameter $d_1$ of the bottom surface 22d of the convex projection portion 22 is 0.75 or higher, preferably 0.80 or higher, and more preferably 0.85 or higher. In addition, an upper limit of a ratio of the diameter $d_2$ of the top surface 22a of the convex projection portion 22 to the diameter $d_1$ of the bottom surface 22d of the convex projection portion 22 is 0.95 or lower.

In a case where the ratio of the diameter $d_2$ of the top surface 22a of the convex projection portion 22 to the diameter $d_1$ of the bottom surface 22d of the convex projection portion 22 is lower than 0.75 and the top surface 22a of the convex projection portion 22 is worn, an area in which the top surfaces 22a of the convex projection portions 22 come into contact with the plate-shaped sample W gradually increases, and thus, the in-plane temperature uniformity of the plate-shaped sample W is reduced when the long-term use.

In a case where the cross-sectional shape of the base body in the thickness direction is convex, a ratio $(d_{2o}/d_{1o})$ of the diameter $d_2$ $(d_{2o})$ of the top surface 22a of the convex projection portion 22 to the diameter $d_1$ $(d_{1o})$ of the bottom surface 22d of the convex projection portion 22 positioned on the outer peripheral portion on the placement surface 11a of the placement plate 11 is preferably smaller than a ratio $(d_{2i}/d_{1i})$ of the diameter $d_2$ $(d_{2i})$ of the top surface 22a of the placement surface 11a of the placement plate 11 to the diameter $d_1$ $(d_{1i})$ of the bottom surface 22d of the convex projection portion 22 positioned on the inner peripheral portion on the placement surface 11a of the placement plate 11. As a result, even though the plate-shaped sample W is repeatedly placed on the placement surface 11a of the placement plate 11 and therefore the top surface 22a of the convex projection portion 22 positioned on the inner peripheral portion of the placement surface 11a of the placement plate 11 is worn, the temperature uniformity of the plate-shaped sample W hardly changes.

In the placement surface 11a, the inner peripheral portion on the placement plate 11 of the placement surface 11a is defined as a region from the center 11b of the placement surface 11a to 55% or higher and 65% or lower of a radius of the placement surface 11a. In addition, the outer peripheral portion on the placement surface 11a of the placement plate 11 is a region outside the inner peripheral portion on the placement surface 11a. The number of the convex projection portions 22 on the inner peripheral portion may be greater than, smaller than, or the same as the number of the convex projection portions 22 on the outer peripheral portion.

Figure 7:
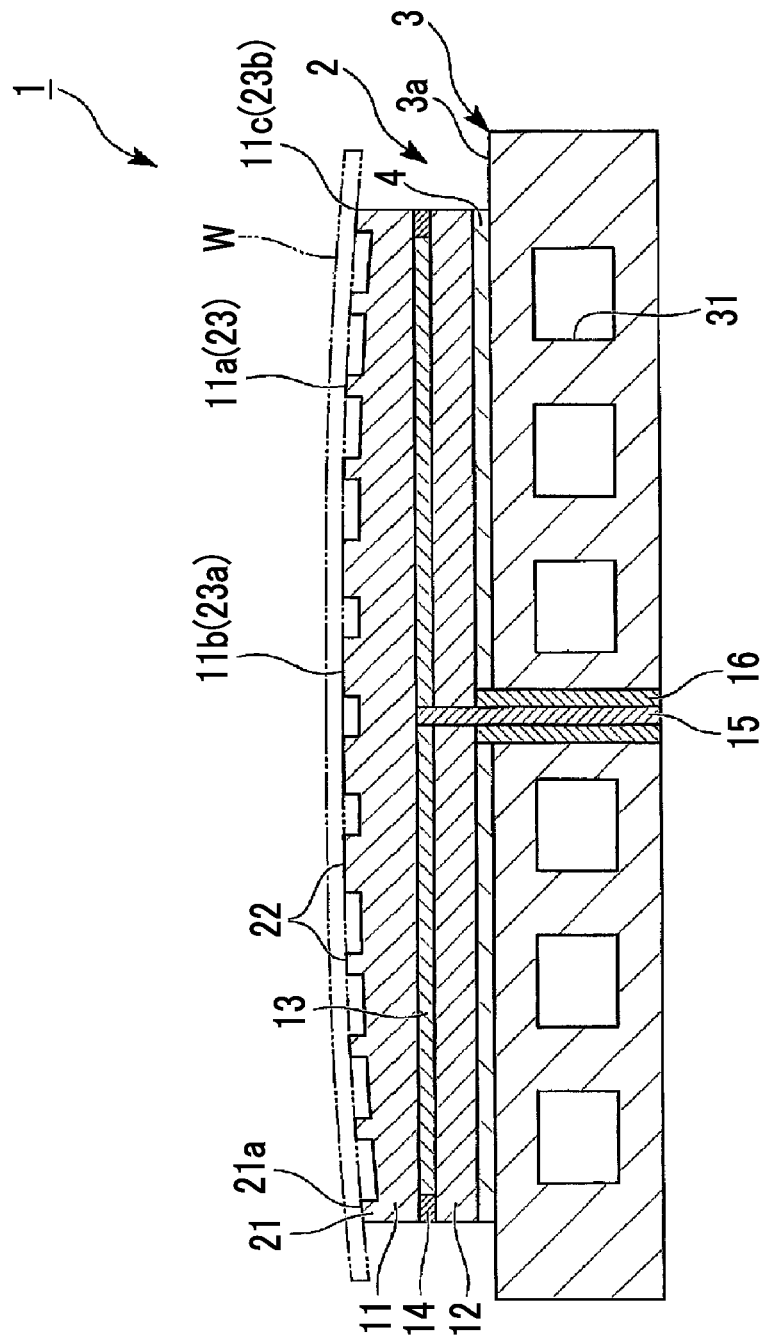
FIG. 7 is a cross-sectional view showing an electrostatic chuck device according to an other embodiment of the present invention.
Figure 9:
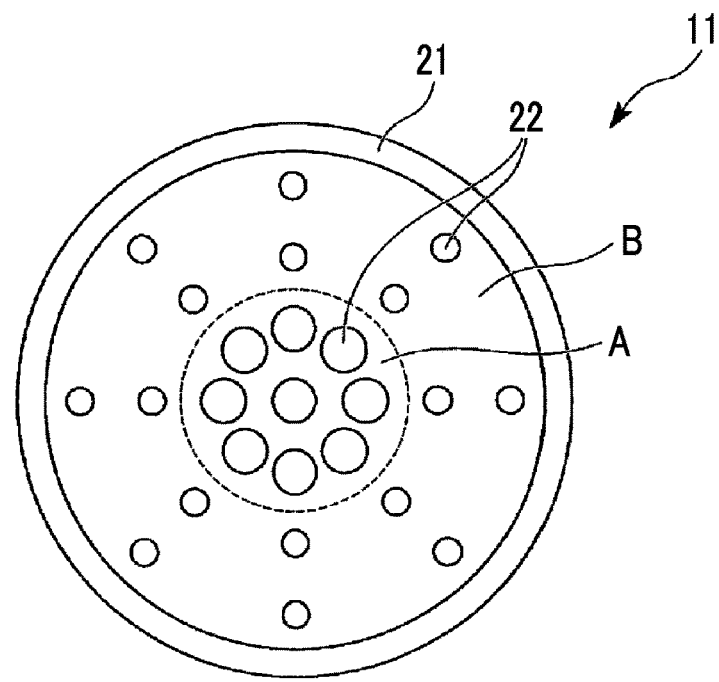
FIG. 9 is a plan view of a placement plate according to an other embodiment of the present invention.

FIG. 7 is a cross-sectional view illustrating an example of the electrostatic chuck device in a case where the cross-sectional shape of the base body in the thickness direction is convex. FIG. 9 is a plan view showing an example of a placement plate corresponding to FIG. 7. In the placement plate 11 of FIG. 9, a diameter of a top surface of a convex projection portion 22 positioned on an inner peripheral portion A is greater than a diameter of a top surface of a convex projection portion 22 positioned on an outer peripheral portion B.

Regarding the number of the convex projection portions 22, it is preferable that the number of the convex projection portions 22 positioned on the inner peripheral portion A is greater than the number of the convex projection portions 22 positioned on the outer peripheral portion B.

Figure 8:
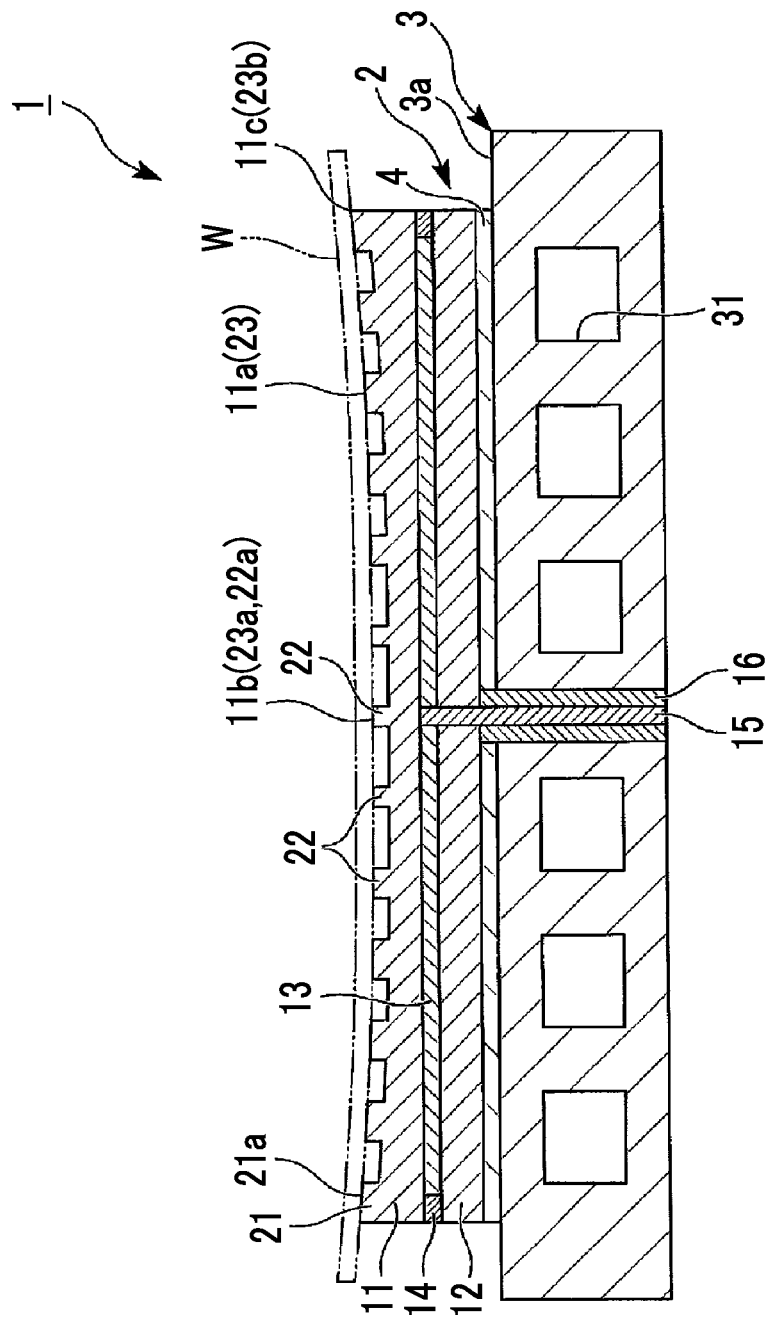
FIG. 8 is a cross-sectional view showing an electrostatic chuck device according to an other embodiment of the present invention.

In a case where the cross-sectional shape of the base body in the thickness direction is concave, as shown in FIG. 8, a ratio $(d_{2o}/d_{1o})$ of the diameter $d_2$ $(d_{2o})$ of the top surface 22a of the convex projection portion 22 to the diameter $d_1$ $(d_{1o})$ of the bottom surface 22d of the convex projection portion 22 positioned on the outer peripheral portion on the placement surface 11a of the placement plate 11 may be greater than a ratio $(d_{2i}/d_{1i})$ of the diameter $d_2$ $(d_{2i})$ of the top surface 22a of the placement surface 11a of the placement plate 11 to the diameter $d_1$ $(d_{1i})$ of the bottom surface 22d of the convex projection portion 22 positioned on the inner peripheral portion on the placement surface 11a of the placement plate 11. As a result, even though the top surface 22a of the convex projection portion 22 positioned on the outer peripheral portion of the placement surface 11a of the placement plate 11 is worn by repeatedly placing the plate-shaped sample W on the placement surface 11a of the placement plate 11, a change in the temperature uniformity of the plate-shaped sample W is small.

In the placement surface 11a, the inner peripheral portion on the placement plate 11 of the placement surface 11a is defined as a region from the center 11b of the placement surface 11a to 55% or higher and 65% or lower of a radius of the placement surface 11a. In addition, the outer peripheral portion on the placement surface 11a of the placement plate 11 is a region outside the inner peripheral portion on the placement surface 11a. The number of the convex projection portions 22 on the inner peripheral portion may be greater than, smaller than, or the same as the number of the convex projection portions 22 on the outer peripheral portion.

Figure 10:
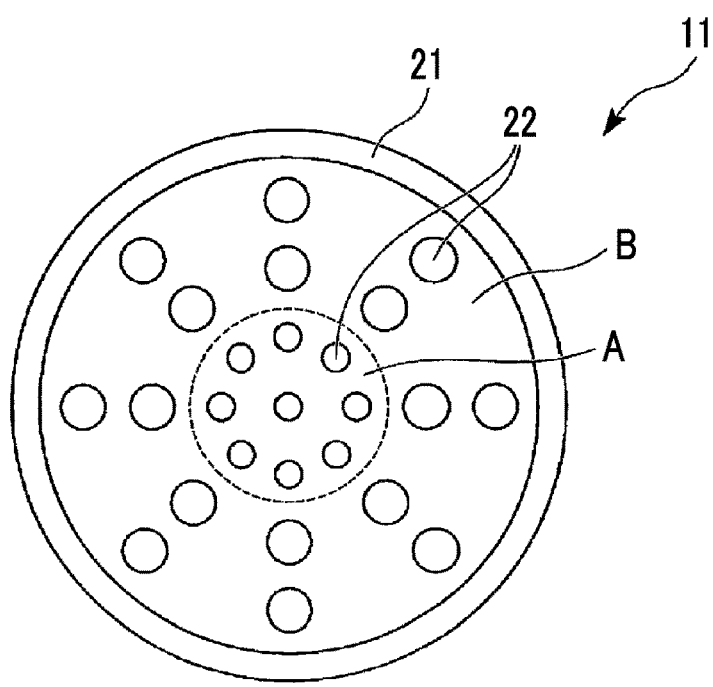
FIG. 10 is a plan view of a placement plate according to an other embodiment of the present invention.

FIG. 8 is a cross-sectional view illustrating an example of the electrostatic chuck device in a case where the cross-sectional shape of the base body in the thickness direction is concave. FIG. 10 is a plan view showing an example of a placement plate corresponding to FIG. 7. In the placement plate 11 of FIG. 10, a diameter of a top surface of a convex projection portion 22 positioned on an outer peripheral portion B is greater than a diameter of a top surface of a convex projection portion 22 positioned on an inner peripheral portion A.

Regarding the number of the convex projection portions 22, it is preferable that the number of the convex projection portions 22 positioned on the outer peripheral portion B is greater than the number of the convex projection portions 22 positioned on the inner peripheral portion A.

The placement surface 11a may be provided with an intermediate portion between the inner peripheral portion and the outer peripheral portion. In this case, the inner peripheral portion of the placement surface 11a is defined as a region from the center 11b of the placement surface 11a to 20% or higher and 30% or lower of a radius of the placement surface 11a. The intermediate portion is a region from the center 11b of the placement surface 11a to 55% or higher to 65% of the radius of the placement surface 11a, from the outside of the inner peripheral portion. The outer peripheral portion is a region outside the intermediate portion.

An angle θ formed by the top surface 22a and the side surface 22b of the convex projection portion 22 is 90° or higher and 160° or lower, and preferably 90° or higher and 150° or lower.

In a case where the angle θ formed by the top surface 22a and the side surface 22b is lower than 90°, a contact area between the top surface 22a of the convex projection portion 22 and the plate-shaped sample W decreases. Therefore, a wear rate increases and particles and the like are generated, which are not preferable. On the other hand, in a case where the angle θ formed by the top surface 22a and the side surface 22b is higher than 160°, the contact area between the top surface 22a of the convex projection portion 22 and the plate-shaped sample W increases. Therefore, in a case of the long-term use, in-plane temperature uniformity of the plate-shaped sample W is reduced.

A center line average surface roughness Ra of the top surface 22a of the convex projection portion 22 is preferably 0.05 µm or lower, more preferably 0.03 µm or lower. Any lower limit can be selected, but may be 0.0001 µm or higher, 0.001 µm or higher, or 0.005 or higher.

In a case where the center line average surface roughness Ra of the top surface 22a of the convex projection portion 22 is 0.05 µm or lower, the plate-shaped sample W is supported by the upper surface 21a of the annular projection portion 21 and the top surface 22a of each of the plurality of convex projection portions 22 in a close contact state. Therefore, the contact surfaces between the upper surface 21a, the top surface 22a, and the plate-shaped sample W are not rubbed against each other, and particles can be hardly generated.

A center line average surface roughness Ra of the upper surface 21a of the annular projection portion 21 is preferably 0.05 µm or lower, more preferably 0.03 µm or lower. Any lower limit can be selected, but may be 0.0001 µm or higher, 0.001 µm or higher, or 0.005 or higher.

In a case where the center line average surface roughness Ra of the upper surface 21a of the annular projection portion 21 is 0.05 µm or lower, the plate-shaped sample W is supported by the upper surface 21a of the annular projection portion 21 and the top surface 22a of each of the plurality of convex projection portions 22 in a close contact state. Therefore, the contact surfaces between the upper surface 21a, the top surface 22a, and the plate-shaped sample W are not rubbed against each other, and particles can be hardly generated.

The center line average surface roughness Ra of the top surface 22a of the convex projection portion 22 and the center line average surface roughness Ra of the upper surface 21a of the annular projection portion 21 in the electrostatic chuck device 1 of the present embodiment can be measured using a surface roughness and contour complex measuring instrument (trade name: SURFCOM NEX, manufactured by TOKYO SEIMITSU CO., LTD.), according to JIS B 0601. In this measurement, a total of six points in three points each at 120° intervals on a concentric circumference are measured on the surface roughness of the top surface 22a of the convex projection portion 22 and the surface roughness of the upper surface 21a of the annular projection portion 21, and an average value thereof is adopted.

The diameter $d_2$ of the top surface 22a of the convex projection portion 22 is preferably 100 µm or higher and 1000 µm or lower, more preferably 100 µm or higher and 800 µm or lower. As necessary, the diameter $d_2$ may be 200 µm or higher and 700 µm or lower, or 400 µm or higher and 600 µm or lower.

In a case where the diameter $d_2$ of the top surface 22a of the convex projection portion 22 is 100 µm or higher, the contact surface between the top surface 22a of the convex projection portion 22 and the plate-shaped sample W is not rubbed against each other, and particles can be hardly generated. In a case where the diameter $d_2$ of the top surface 22a of the convex projection portion 22 is 1000 µm or lower, the temperature uniformity of the plate-shaped sample W on the placement surface 11a of the placement plate 11 is not impaired.

In a case where the cross-sectional shape of the base body in the thickness direction is concave, a total contact area B22 between the convex projection portions 22 positioned on the outer peripheral portion on the placement surface 11a of the placement plate 11 and the plate-shaped sample W is preferably greater than a total contact area A22 between the convex projection portions 22 positioned on the inner peripheral portion on the placement surface 11a of the placement plate 11 and the plate-shaped sample W. Since the placement surface 11a of the placement plate 11 is formed in a concave shape, the outer peripheral portion is more likely to be worn. Therefore, by increasing the total contact area, the convex projection portions 22 on the inner peripheral portion and the outer peripheral portion can be uniformly worn.

The contact area between the convex projection portions 22 positioned on the outer peripheral portion on the placement surface 11a of the placement plate 11 and the plate-shaped sample W, and the contact area between the convex projection portions 22 positioned on the inner peripheral portion on the placement surface 11a of the placement plate 11 and the plate-shaped sample W can be determined by calculating the contact area between the convex projection portions 22 and the plate-shaped sample W from the diameter of the top surface 22a of the convex projection portion 22 obtained by a surface roughness and contour complex measuring instrument (trade name: SURFCOM NEX, manufactured by TOKYO SEIMITSU CO., LTD.) and multiplying by the number of the convex projection portions 22.

In a case where the cross-sectional shape of the base body in the thickness direction is convex, assuming that a ratio of a total contact area between the convex projection portions 22 positioned on the inner peripheral portion on the placement surface 11a of the placement plate 11 and the plate-shaped sample W to a total area of the inner peripheral portion on the placement surface 11a of the placement plate 11 is denoted by A1, and a ratio of a total contact area between the convex projection portions 22 positioned on the outer peripheral portion on the placement surface 11a of the placement plate 11 and the plate-shaped sample W to a total area of the outer peripheral portion on the placement surface 11a of the placement plate 11 is denoted by B1, the ratio A1 is preferably greater than the ratio B1. As a result, a change due to wear in a contact area between the top surface 22a of the convex projection portion 22 and the plate-shaped sample W is small even though the plate-shaped sample W is repeatedly placed on the placement surface 11a of the placement plate 11. Thus, a change in the in-plane temperature uniformity of the plate-shaped sample W over time is small. In addition, since the plate-shaped sample W can be attracted by uniform force to the outer peripheral portion and the inner peripheral portion of the placement plate, the plate-shaped sample W can be prevented from being deformed.

Furthermore, in a case where the cross-sectional shape of the base body in the thickness direction is convex and there is no intermediate portion on the placement surface 11a of the placement plate 11, a ratio of a ratio A to a ratio B (A1/B1) is preferably 1.5 or higher, and more preferably 2.0 or higher. The upper limit of the ratio (A1/B1) may be 10.0 or lower, or may be 9.0 or lower. The ratio is preferably 2.8 to 8.0, more preferably 3.0 to 7.0.

In a case where the ratio (A1/B1) is 1.5 or higher and 10.0 or lower, a change due to wear in a contact area between the top surface 22a of the convex projection portion 22 and the plate-shaped sample W is small even though the plate-shaped sample W is repeatedly placed on the placement surface 11a of the placement plate 11. Thus, a change in the in-plane temperature uniformity of the plate-shaped sample W over time is small and the in-plane temperature uniformity is ensured.

In addition, in a case where the cross-sectional shape of the base body in the thickness direction is convex and there is the intermediate portion on the placement surface 11a of the placement plate 11, assuming that a ratio of a total contact area between the convex projection portions 22 positioned on the intermediate portion on the placement surface 11a of the placement plate 11 and the plate-shaped sample W to a total area of the intermediate portion on the placement surface 11a of the placement plate 11 is denoted by C1, the ratio A1, the ratio B1, and the ratio C1 preferably satisfy the following Expression (1).

$$A1 > C1 > B1 \tag{1}$$

When the ratio A1, the ratio B1, and the ratio C1 satisfy the above Expression (1), a change due to wear in a contact area between the top surface 22a of the convex projection portion 22 and the plate-shaped sample W is small even though the plate-shaped sample W is repeatedly placed on the placement surface 11a of the placement plate 11. Thus, a change in the in-plane temperature uniformity of the plate-shaped sample W over time is small and the in-plane temperature uniformity is ensured.

Furthermore, in a case where the cross-sectional shape of the base body in the thickness direction is convex and there is the intermediate portion on the placement surface 11a of the placement plate 11, a ratio of a ratio A1 to a ratio C1 (A1/C1) is preferably 1.25 or higher, and more preferably 1.5 or higher. The upper limit of the ratio (A1/C1) may be 5.0 or lower, or may be 4.5 or lower. Specifically, the ratio of the ratio A1 to the ratio C1 (A1/C1) is preferably 1.25 to 5.0, and more preferably 1.5 to 4.5. The ratio may be 2.0 to 4.0 or 2.5 to 3.5, as necessary.

In a case where the ratio (A1/C1) is 1.25 or higher and 5.0 or lower, even though the top surface 22a of the convex projection portion 22 is worn by repeatedly placing the plate-shaped sample W on the placement surface 11a of the placement plate 11, a change in a contact area with the plate-shaped sample W is small. Thus, a change in the in-plane temperature uniformity of the plate-shaped sample W over time is small and the in-plane temperature uniformity is ensured.

Furthermore, in a case where the cross-sectional shape of the base body in the thickness direction is convex and there is the intermediate portion on the placement surface 11a of the placement plate 11, a ratio (C1/B1) of a ratio C1 to a ratio B1 is preferably 1.25 or higher, and more preferably 1.5 or higher. The upper limit of the ratio (C1/B1) may be 5.0 or lower, or may be 4.5 or lower. Specifically, the ratio (C1/B1) of the ratio C1 to the ratio B1 is preferably 1.25 to 5.0, and more preferably 1.5 to 4.5. The ratio may be 2.0 to 4.0 or 2.5 to 3.5, as necessary.

In a case where the ratio (C1/B1) is 1.25 or higher and 5.0 or lower, even though the top surface 22a of the convex projection portion 22 is worn by repeatedly placing the plate-shaped sample W on the placement surface 11a of the placement plate 11, a change in a contact area with the plate-shaped sample W is small. Thus, a change in the in-plane temperature uniformity of the plate-shaped sample W over time is small and the in-plane temperature uniformity is ensured.

In a case where the cross-sectional shape of the base body in the thickness direction is concave, assuming that a total contact area between the convex projection portions 22 positioned on the inner peripheral portion on the placement surface 11a of the placement plate 11 and the plate-shaped sample W is denoted by A, and a total contact area between the convex projection portions 22 positioned on the outer peripheral portion on the placement surface 11a of the placement plate 11 and the plate-shaped sample W is denoted by B22, a ratio (B22/A22) of the total B to the total A22 is preferably 1.5 or higher and more preferably 2.0 or higher. The upper limit of the ratio (B22/A22) may be 10.0 or lower, or may be 9.0 or lower. Specifically, the ratio (B22/A22) of the total B to the total A22 is preferably 1.5 to 10.0, and more preferably 2.0 to 9.0. The ratio is preferably 2.8 to 8.0, more preferably 3.0 to 7.0.

In a case where the ratio (B22/A22) is 1.5 or higher and 10.0 or lower, a change due to wear in a contact area between the top surface 22a of the convex projection portion 22 and the plate-shaped sample W is small even though the plate-shaped sample W is repeatedly placed on the placement surface 11a of the placement plate 11. Thus, a change in the in-plane temperature uniformity of the plate-shaped sample W over time is small and the in-plane temperature uniformity is ensured. In addition, since the plate-shaped sample W can be attracted by uniform force to the outer peripheral portion and the inner peripheral portion of the placement plate, the plate-shaped sample W can be prevented from being deformed.

In addition, in a case where the cross-sectional shape of the base body in the thickness direction is concave and there is the intermediate portion on the placement surface 11a of the placement plate 11, assuming that a total contact area between the convex projection portions 22 positioned on the intermediate portion on the placement surface 11a of the placement plate 11 and the plate-shaped sample W is denoted by C, the total A22, the total B22, and the total C22 preferably satisfy the following Expression.

$$B22 > C22 > A22 \tag{2}$$

In a case where the total A22, the total B22, and the total C22 satisfy the above Expression (2), even though the top surface 22a of the convex projection portion 22 is worn by repeatedly 25 placing the plate-shaped sample W on the placement surface 11a of the placement plate 11, a change in the in-plane temperature uniformity of the plate-shaped sample W over time is small, and the in-plane temperature uniformity is ensured.

In addition, there is the intermediate portion on the placement surface 11a of the placement plate 11, a ratio (C22/A22) of the total C22 to the total A22 is preferably 1.25 or higher, and more preferably 1.5 or higher. The upper limit of the ratio (C22/A22) may be 5.0 or lower, or may be 4.5 or lower. Specifically, the ratio (C22/A22) of the total C22 to the total A22 is preferably 1.25 to 5.0, and more preferably 1.5 to 4.5. The ratio may be 2.0 to 4.0 or 2.5 to 3.5, as necessary.

In a case where the ratio (C22/A22) is 1.25 or higher and 5.0 or lower, even though the top surface 22a of the convex projection portion 22 is worn by repeatedly placing the plate-shaped sample W on the placement surface 11a of the placement plate 11, a change in a contact area with the plate-shaped sample W is small. Thus, a change in the in-plane temperature uniformity of the plate-shaped sample W over time is small and the in-plane temperature uniformity is ensured.

Furthermore, in a case where the cross-sectional shape of the base body in the thickness direction is concave and there is the intermediate portion on the placement surface 11a of the placement plate 11, a ratio (B22/C22) of the total B22 to the total C22 is preferably 1.25 or higher, and more preferably 1.5 or higher. The upper limit of the ratio (B22/C22) may be 5.0 or lower, or may be 4.5 or lower.

Specifically, the ratio (B22/C22) of the total B22 to the total C22 is preferably 1.25 to 5.0, and more preferably 1.5 to 4.5. The ratio may be 2.0 to 4.0 or 2.5 to 3.5, as necessary.

In a case where the ratio (B22/C22) is 1.25 or higher and 5.0 or lower, even though the top surface 22a of the convex projection portion 22 is worn by repeatedly placing the plate-shaped sample W on the placement surface 11a of the placement plate 11, a change in a contact area with the plate-shaped sample W is small. Thus, a change in the in-plane temperature uniformity of the plate-shaped sample W over time is small and the in-plane temperature uniformity is ensured.

Figure 11:
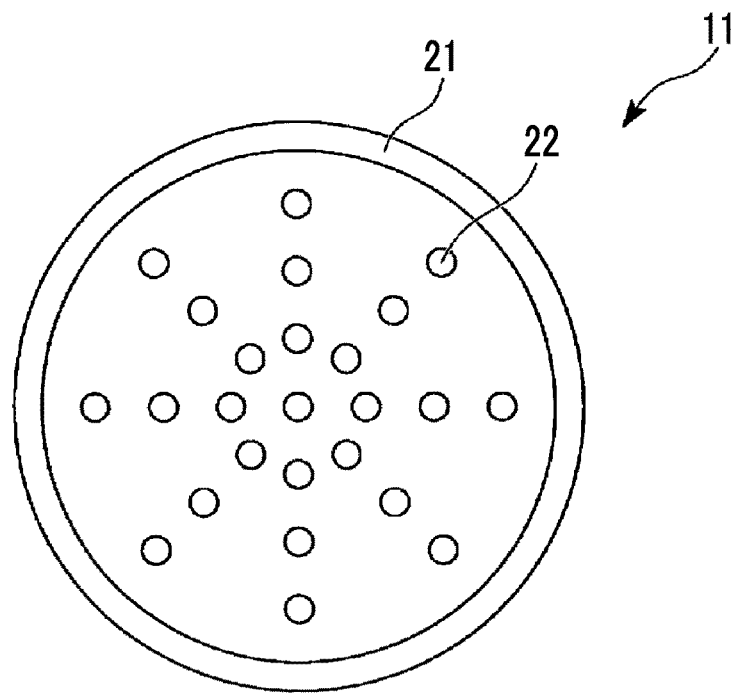
FIG. 11 is a plan view of a placement plate according to an other embodiment of the present invention.
Figure 12:
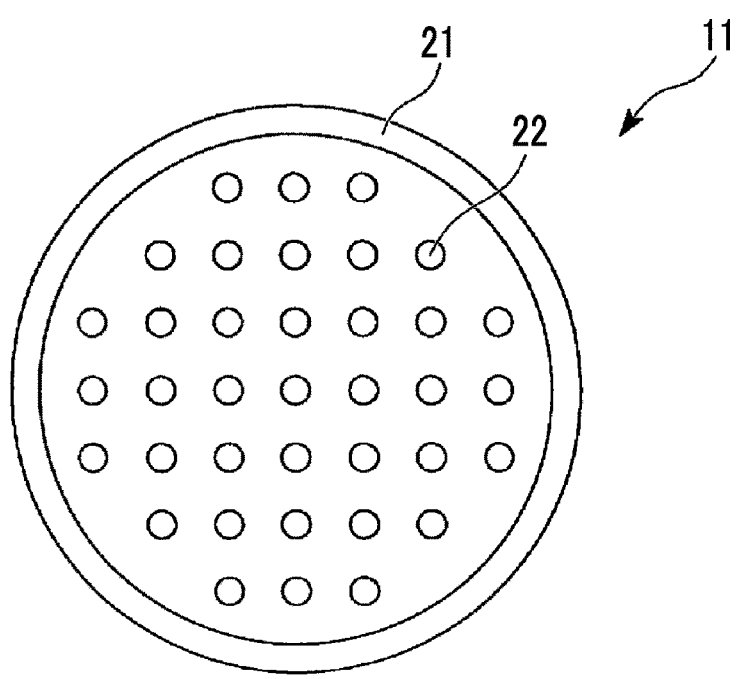
FIG. 12 is a plan view of a placement plate according to an other embodiment of the present invention.
Figure 13:
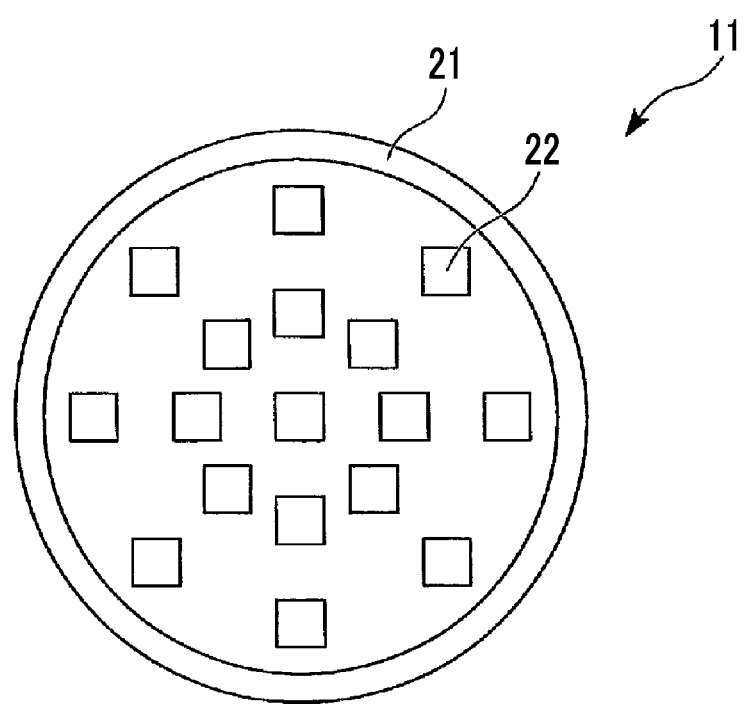
FIG. 13 is a plan view of a placement plate according to an other embodiment of the present invention.

FIGS. 11 to 13 are plan views showing an other example of a placement plate.

The convex projection portions 22 may be positioned radially as shown in FIG. 11, or may be positioned on a plurality of concentric circles having different diameters.

The convex projection portions 22 may be arranged at regular intervals in a radial direction as shown in FIG. 12, and may also be arranged at regular intervals in a direction orthogonal to the radial direction.

The convex projection portions 22 may have a polygonal cross-section, and more specifically, may be a quadrangle as shown in FIG. 13.

The placement plate 11 and the supporting plate 12 formed as main components of the electrostatic chuck portion 2 are disk-shaped having the same overlapped surface shape, and are formed of ceramics having an electric resistance of $1 \times 10^{14}$ Ω·cm or higher and a relative permittivity at a frequency of 20 Hz is 13 or higher, preferably 18 or higher.

Here, the reason why the electric resistance of the placement plate 11 and the supporting plate 12 is limited to $1 \times 10^{14}$ Ω·cm or higher and the relative permittivity at a frequency of 20 Hz is limited to 13 or higher is that in the above range, the temperature of the plate-shaped sample W is uniform and a leakage amount (leak amount) of a sealing medium decreases so as to stabilize plasma.

Here, in a case where the electric resistance is lower than $1 \times 10^{14}$ Ω·cm, insulation properties used in a base body becomes insufficient. Thus, due to an increase in leakage current to the attracted plate-shaped sample W, a device formed on the plate-shaped sample W is destroyed and a desorption failure of the plate-shaped sample W occurs with an increase in residual attraction force, which is not preferable.

Furthermore, when the relative permittivity at the frequency of 20 Hz is lower than 13, in a case where a voltage is applied between the plate-shaped sample W and the internal electrode for electrostatic attraction 13, sufficient electrostatic attraction force for attracting the plate-shaped sample W cannot be generated. As a result, the plate-shaped sample W cannot be attracted and fixed to the convex surface or concave surface 23, which is not preferable.

When used in an etching device generating plasma at high-frequency, it is preferable that the relative permittivity at 1 MHz or higher is smaller than the relative permittivity at 20 Hz in terms of high-frequency transmittance.

An example of ceramics forming the placement plate 11 and the supporting plate 12 preferably includes insulating ceramics having mechanical strength and durability against corrosive gas and plasma thereof such as an aluminum oxide-silicon carbide ($Al_2O_3$—SiC) composite sintered compact, an aluminum oxide ($Al_2O_3$) sintered compact, an aluminum nitride (AlN) sintered compact, an yttrium oxide ($Y_2O_3$) sintered compact.

A particle diameter of such ceramics is preferably 2 μm or lower, more preferably 1 μm or lower.

In this way, by setting a ceramics diameter to 2 μm or lower so as to use ceramics having a small particle diameter, generation of particles due to a rub between the plate-shaped sample W, and the annular projection portion 21 and the plurality of convex projection portions 22 generated together with deformation of the plate-shaped sample W during attraction can be suppressed.

In addition, a width and a height of the annular projection portion 21 and heights and sizes of the plurality of convex projection portions 22 can be reduced, and thereby, the contact area between the annular projection portion 21, the plurality of convex projection portions 22, and the plate-shaped sample W can be reduced.

In the annular projection portion 21 and the plurality of convex projection portions 22 provided on the placement surface 11a of the placement plate 11, the upper surface 21a of the annular projection portion 21 and the top surface 22a of each of the plurality of convex projection portions 22 are positioned on the convex surface having the center of the placement surface 11a as the highest position or the concave surface 23 having the center of the placement surface 11a as the lowest position. Therefore, the plate-shaped sample W reliably comes into contact with the annular projection portion 21 and the plurality of convex projection portions 22 over the entire surface of the plate-shaped sample W. Therefore, when the plate-shaped sample W is attracted or desorbed, the plate-shaped sample W is not deformed, and the temperature of the plate-shaped sample W is also made uniform.

By positioning the upper surface 21a of the annular projection portion 21 and the top surface 22a of each of the plurality of convex projection portions 22 on the convex surface or concave surface 23, the plate-shaped sample W is supported by the annular projection portion 21 and the plurality of convex projection portions 22 in the close contact state with each other, and a gap, a rub, or the like is not generated between the plate-shaped sample W, and the annular projection portion 21 and the plurality of convex projection portions 22. Therefore, particles are hardly generated.

In the annular projection portion 21 and the plurality of convex projection portions 22 provided on the placement surface 11a of the placement plate 11, the height $h_2$ of the upper surface 21a of the annular projection portion 21 (in FIG. 2, the length recessed in the thickness direction of the placement plate 11 from the placement surface 11a) is the same as the height $h_3$ of the top surface 22a of each of the plurality of convex projection portions 22 (in FIG. 2, the length recessed in the thickness direction of the placement plate 11 from the placement surface 11a). In addition, a region other than the annular projection portion 21 and the plurality of convex projection portions 22 of the placement surface 11a is a flow channel for flowing a sealing medium such as nitrogen gas or helium gas.

As described above, the height $h_2$ of the upper surface 21a of the annular projection portion 21 is the same as the height $h_3$ of the top surface 22a of each of the plurality of convex projection portions 22, and therefore a depth of the flow channel that is surrounded by the annular projection portion 21 and the plurality of convex projection portions 22 and flows the sealing medium such as nitrogen gas or helium gas becomes uniform. Accordingly, heat transfer in the flow channel of the sealing medium becomes constant, and a temperature of the plate-shaped sample W is made uniform, so that plasma can be stably generated.

The sum of an area of the upper surface 21a of the annular projection portion 21 and a total area of the top surface 22a of each of the plurality of convex projection portions 22 is preferably 30% or lower of an area of the placement surface 11a, and more preferably 25% or lower.

Here, by setting the sum of the area of the upper surface 21a of the annular projection portion 21 and the total area of the top surfaces 22a of the plurality of convex projection portions 22 to 30% or lower of the area of the placement surface 11a, a ratio of a total area of the flow channels of the sealing medium such as nitrogen gas or helium gas to the area of the placement surface 11a can be increased. Therefore, temperature uniformity of the sealing medium can be improved.

As a result, the leakage amount (leak amount) of the sealing medium can be reduced, and plasma can be stably generated.

A total thickness of the placement plate 11, the supporting plate 12, the internal electrode for electrostatic attraction 13 and the insulating material layer 14, that is, a thickness of the electrostatic chuck portion 2 is preferably 1 mm or higher and 10 mm or lower. In a case where the thickness of the electrostatic chuck portion 2 is 1 mm or higher, mechanical strength of the electrostatic chuck portion 2 can be ensured. On the other hand, in a case where the thickness of the electrostatic chuck portion 2 is 10 mm or lower, heat capacity of the electrostatic chuck portion 2 does not become too large, and thermal response of the plate-shaped sample W to be placed is not deteriorated. Furthermore, an in-plane temperature of the plate-shaped sample W can be maintained at a desired temperature pattern without increasing the heat transfer of the electrostatic chuck portion in the lateral direction.

Particularly, the thickness of the placement plate 11 is preferably 0.3 mm or higher and 2.0 mm or lower. The reason is that in a case where the thickness of the placement plate 11 is 0.3 mm or higher, there is no discharging risk due to the voltage applied to the internal electrode for electrostatic attraction 13. On the other hand, in a case where the thickness of the placement plate 11 is 2.0 mm or lower, the plate-shaped sample W can be sufficiently attracted and fixed, and the plate-shaped sample W can be sufficiently heated.

The internal electrode for electrostatic attraction 13 is an electrode used as an electrode for an electrostatic chuck in order to generate an electric charge and to fix a plate-shaped sample by electrostatic attraction force. A shape and size of the internal electrode for electrostatic attraction 13 are appropriately adjusted depending on a use.

The internal electrode for electrostatic attraction 13 is formed of, for example, conductive ceramics such as an aluminum oxide-tantalum carbide ($Al_2O_3$—$Ta_4C_5$) conductive composite sintered compact, an aluminum oxide-tungsten ($Al_2O_3$—W) conductive composite sintered compact, an aluminum oxide-silicon carbide ($Al_2O_3$—SiC) conductive composite sintered compact, an aluminum nitride-tungsten (AlN—W) conductive composite sintered compact, an aluminum nitride-tantalum (AlN—Ta) conductive composite sintered compact, an yttrium oxide-molybdenum ($Y_2O_3$—Mo) conductive composite sintered compact, or high melting point metals such as tungsten (W), tantalum (Ta), and molybdenum (Mo).

A thickness of the internal electrode for electrostatic attraction 13 is not particularly limited, but is preferably 5 µm or higher and 40 µm or lower, particularly preferably 20 µm or higher and 30 µm or lower. In a case where the thickness of the internal electrode for electrostatic attraction 13 is 5 µm or higher, sufficient conductivity can be ensured. On the other hand, in a case where the thickness of the internal electrode for electrostatic attraction 13 is 40 µm or lower, cracks due to a difference in a thermal expansion coefficient between the internal electrode for electrostatic attraction 13, and the placement plate 11 and the supporting plate 12 are less likely to be formed at a bonding interface between the internal electrode for electrostatic attraction 13, and the placement plate 11 and the supporting plate 12.

The internal electrode for electrostatic attraction 13 can be easily formed by, for example, a film forming method such as a sputtering method or a vapor deposition method, or a coating method such as a screen printing method.

The insulating material layer 14 surrounds the internal electrode for electrostatic attraction 13, protects the internal electrode for electrostatic attraction 13 from corrosive gas and plasma thereof, and is bonded to and integrated with a boundary between the placement plate 11 and the supporting plate 12, that is, the outer peripheral region other than the internal electrode for electrostatic attraction 13. The insulating material layer 14 is formed of insulating materials having the same composition or the same main component as materials forming the placement plate 11 and the supporting plate 12.

The power supply terminal 15 is a rod-shaped terminal provided in order to apply a direct-current voltage to the internal electrode for electrostatic attraction 13. Materials of the power supply terminal 15 are not particularly limited as long as the materials are conductive materials having excellent heat resistance, but the materials having a thermal expansion coefficient approximated to the thermal expansion coefficient of the internal electrode for electrostatic attraction 13 and the supporting plate 12, and for example, conductive ceramics for forming the internal electrode for electrostatic attraction 13 or metal materials such as tungsten (W), tantalum (Ta), molybdenum (Mo), niobium (Nb), and Kovar alloy are preferably used.

The power supply terminal 15 is insulated from the cooling base portion 3 by an insulator 16 having an insulating property.

The power supply terminal 15 is bonded to and integrated with the supporting plate 12, and the placement plate 11 and the supporting plate 12 are bonded and integrated through the internal electrode for electrostatic attraction 13 and the insulating material layer 14 to form the electrostatic chuck portion 2.

[Cooling Base Portion]

The cooling base portion 3 is a member for cooling the electrostatic chuck portion 2 to maintain a temperature within a desired range, and is a thick disk-shaped member.

As the cooling base portion 3, for example, a water-cooling base body in which a flow channel 31 for circulating water is formed therein, and the like are preferable.

Materials forming the cooling base portion 3 is not particularly limited as long as the materials are metals having excellent thermal conductivity, conductivity, and workability, or compound materials containing these metals, and for example, aluminum (Al), aluminum alloy, copper (Cu), copper alloy, stainless steel (SUS) and the like are preferably used. It is preferable that at least a surface of the cooling base portion 3 exposed to plasma is subjected to insulation treatment. As such an insulation treatment, alumite treatment or insulation film treatment of applying an insulation film of alumina or the like is preferable.

[Adhesive Layer]

The adhesive layer 4 is used for bonding and integrating the electrostatic chuck portion 2 with the cooling base portion 3.

A thickness of the adhesive layer 4 is preferably 100 μm or higher and 200 μm or lower, more preferably 130 μm or higher and 170 μm or lower.

In a case where the thickness of the adhesive layer 4 is within the above range, an adhesive strength between the electrostatic chuck portion 2 and the cooling base portion 3 can be sufficiently maintained. Furthermore, sufficient thermal conductivity between the electrostatic chuck portion 2 and the cooling base portion 3 can be ensured.

The adhesive layer 4 can be formed of, for example, a cured body obtained by heating and curing a silicone-based resin composition, an acrylic resin, an epoxy resin, or the like.

The silicone-based resin composition is preferably a silicon compound having a siloxane bond (Si—O—Si) since a resin has excellent heat resistance and elasticity.

As such a silicone-based resin composition, a silicone resin having a thermosetting temperature of 70° C. to 140° C. is particularly preferable.

Here, in a case where the thermosetting temperature is lower than 70° C., the curing is not sufficiently performed in a bonding process when the electrostatic chuck portion 2 and the cooling base portion 3 are bonded in a state of being opposed to each other. Therefore, there is a possibility that usability deteriorates, which is not preferable. On the other hand, in a case where the thermosetting temperature is higher than 140° C., a difference in thermal expansion between the electrostatic chuck portion 2 and the cooling base portion 3 is large, and stress between the electrostatic chuck portion 2 and the cooling base portion 3 increases. Therefore, there is a possibility that peeling therebetween may occur, which is not preferable.

As the silicone resin, a resin having a Young's modulus of 8 MPa after curing or lower is preferable. Here, in a case where the Young's modulus after curing higher than 8 MPa, the difference in thermal expansion between the electrostatic chuck portion 2 and the cooling base portion 3 cannot be offset when a heat cycle of increasing and decreasing the temperature is applied to the adhesive layer 4, and therefore, durability of the adhesive layer 4 is reduced, which is not preferable.

The adhesive layer 4 contains surface-coated aluminum nitride (AlN) particles on which a filler formed of inorganic oxide, inorganic nitride, or inorganic oxynitride having an average particle diameter of 1 μm or higher and 30 μm or lower, preferably 1 μm or higher and 20 μm or lower, and more preferably 1 μm or higher and 10 μm or lower, for example, coating layers consisting of silicon oxide ($SiO_2$) that are formed on surfaces of aluminum nitride (AlN) particles is formed.

The surface-coated aluminum nitride (AlN) particles are mixed to improve a thermal conductivity of the silicone resin, and a heat transfer coefficient of the adhesive layer 4 can be controlled by adjusting a mixing ratio thereof.

That is, the mixing ratio of the surface-coated aluminum nitride (AlN) particles is increased, so that the heat transfer coefficient of an organic adhesive forming the adhesive layer 4 can be increased.

In addition, since the coating layers consisting of silicon oxide ($SiO_2$) are formed on the surfaces of the aluminum nitride (AlN) particles, the surface-coated aluminum nitride (AlN) particles exhibit excellent water resistance compared with mere aluminum nitride (AlN) particles of which surfaces are not coated are coated. Therefore, the durability of the adhesive layer 4 containing the silicone-based resin composition as a main component can be ensured, and as a result, the durability of the electrostatic chuck device 1 can be significantly improved.

In the surface-coated aluminum nitride (AlN) particles, since the surfaces of the aluminum nitride (AlN) particles are coated with the coating layer consisting of silicon oxide ($SiO_2$) having excellent water resistance, the aluminum nitride (AlN) is not hydrolyzed by moisture in the atmosphere, the heat transfer coefficient of aluminum nitride (AlN) is not reduced, and the durability of the adhesive layer 4 is improved.

The surface-coated aluminum nitride (AlN) particles do not become a contaminant source for the plate-shaped sample W such as a semiconductor wafer, and can be regarded as a preferable filler from this point as well.

The adhesive layer 4 may be formed of a thermosetting acrylic resin adhesive having the Young's modulus of 1 GPa or lower and flexibility (Shore hardness of A100 or lower). In this case, the filler may or may not be contained.

According to the electrostatic chuck device 1 of the present embodiment, a change in the contact area between the top surface 22a of the convex projection portion 22 and the plate-shaped sample W is small even though the plate-shaped sample W is repeatedly placed on the placement surface 11a of the placement plate 11 and the top surface 22a of the convex projection portion 22 is worn. Thus, the plate-shaped sample W can be attracted and fixed to the placement surface 11a of the placement plate 11 in a state where the plate-shaped sample W comes into close contact with the placement surface 11a of the placement plate 11, and the temperature of the plate-shaped sample W is stably controlled to be uniform.

<Method of Manufacturing Electrostatic Chuck Device>

The method of manufacturing a electrostatic chuck device of the present embodiment is a method of manufacturing a electrostatic chuck device of the present embodiment including a step of bonding the electrostatic chuck portion and the cooling base portion via an adhesive, and a step of processing a placement surface of a placement plate of the electrostatic chuck portion bonded to a cooling base portion to form a cross-sectional shape of a base body in the thickness direction to be concave or convex, which is a curved shape that gradually curves from the center of the placement surface of the placement plate toward an outer periphery of the placement surface of the placement plate.

Hereinafter, a method of manufacturing an electrostatic chuck device according to the present embodiment will be described.

First, a pair of plate-shaped bodies serving as the placement plate 11 and the supporting plate 12 are prepared from an aluminum oxide-silicon carbide ($Al_2O_3$—SiC) composite sintered compact or an yttrium oxide ($Y_2O_3$) sintered compact.

For example, a mixed powder containing a silicon carbide powder and an aluminum oxide powder, or an yttrium oxide powder is molded into a desired shape to obtain a molded body, and then the molded body is calcinated at a temperature of about 1400° C. to 2000° C. in a non-oxidative atmosphere, preferably in an inert atmosphere. Thus, a pair of plate-shaped bodies can be obtained.

Next, a plurality of fixing holes for fitting and maintaining the power supply terminal 15 are formed on one plate-shaped body, and the power supply terminal 15 is fixed to the fixing hole.

Next, a coating liquid for forming an internal electrode for electrostatic attraction, in which a conductive material such as the above described conductive ceramics is dispersed in an organic solvent, is applied to a predetermined region of a surface of the plate-shaped body on which the power supply terminal 15 is fitted so as to come into contact with the power supply terminal 15, and is dried to form a layer for formation of an internal electrode for electrostatic attraction. Furthermore, an insulating material layer containing powder materials having the same composition or the same main component as the plate-shaped body is formed at a region other than the region where the layer formed of an internal electrode for electrostatic attraction is formed on the plate-shaped body.

Next, an other plate-shaped body is overlapped on the layer for formation of an internal electrode for electrostatic attraction and the insulating material layer formed on the one plate-shaped body, and the entire layers are integrated by hot calender at a high temperature and a high pressure. The atmosphere in the hot calender is preferably a vacuum or an inert atmosphere such as Ar, He, or $N_2$.

Furthermore, the pressure when uniaxial pressing is performed in the hot calender is preferably 5 MPa to 10 MPa, and the temperature is preferably 1400° C. to 1850° C.

By the hot calender, the layer for formation of an internal electrode for electrostatic attraction is calcinated to form an internal electrode for electrostatic attraction 13 formed of a conductive composite sintered compact. At the same time, the two plate-shaped bodies each become the placement plate 11 and the supporting plate 12 and are bonded to and integrated with the internal electrode for electrostatic attraction 13 and the insulating material layer 14 to form the electrostatic chuck portion 2.

Next, an adhesive consisting of a silicone-based resin composition is applied to a predetermined region of one main surface 3a of the cooling base portion 3. Here, an application amount of the adhesive is adjusted so that the electrostatic chuck portion 2 and the cooling base portion 3 can be bonded to and integrated with each other.

Examples of a method for applying the adhesive include a bar coating method, a screen printing method, and the like in addition to an application method using a spatula or the like by hand.

After applying the adhesive to the one main surface 3a of the cooling base portion 3, the electrostatic chuck portion 2 and the cooling base portion 3 to which the adhesive is applied are overlapped.

In addition, the power supply terminal 15 and the insulator 16, which are provided in a standing state, are inserted and fitted into the power supply terminal receiving hole (not shown) drilled through the cooling base portion 3.

Next, the electrostatic chuck portion 2 is pressed to the cooling base portion 3 at a predetermined pressure, and the electrostatic chuck portion 2 and the cooling base portion 3 are bonded to and integrated with each other. Accordingly, the electrostatic chuck portion 2 and the cooling base portion 3 are bonded and integrated via the adhesive layer 4.

Next, for example, a surface protection tape is stuck on a side surface (the surface along the thickness direction of a laminate) and a back surface (the surface opposite to the placement surface 11a of the placement plate 11 of the electrostatic chuck portion 2) of a laminate including the electrostatic chuck portion 2, the adhesive layer 4, and the cooling base portion 3 so that the surfaces are not scratched or particles are not adhered thereto, and thus the side surface and the back surface of the laminate is masked to expose only the placement surface 11a of the placement plate 11.

Next, grinding processing and polishing processing is performed on the placement surface 11a of the placement plate 11 of the electrostatic chuck portion 2 to form the cross-sectional shape of the placement plate 11 in the thickness direction to be a curved shape that curves in such a manner that a height with reference to the one main surface 3a of the cooling base portion 3 gradually increases from the center 23a of the convex surface or concave surface 23 (the center 11b of the placement surface 11a) toward the outer periphery 23b of the convex surface or concave surface 23 (corresponding to the outer periphery of the placement surface 11a).

Next, mechanical processing such as blasting processing is performed on a predetermined position of the placement surface 11a of the placement plate 11 of the electrostatic chuck portion 2, the annular projection portion 21 and the plurality of convex projection portions 22 are formed, and a bottom surface portion excluding the annular projection portion 21 and the plurality of convex projection portions 22 is formed as a bottom surface 11d of the placement surface 11a of the placement plate 11.

Here, a method of forming the convex projection portion 22 on the placement surface 11a of the placement plate 11 will be described with reference to FIGS. 4 to 6.

The convex projection portion 22 can be formed by, for example, mechanical processing such as grindstone processing, laser engraving, or sandblasting processing. Polishing as finishing can be efficiently performed by buffing using fine abrasive particles and buff materials, or ultrasonic polishing using fine abrasive particles and ultrasonic waves.

In addition, in a step of forming the convex projection portion 22, the annular projection portion 21 (see FIG. 1) can be formed at the same time by performing the same step on the periphery of the placement surface 11a.

In the present embodiment, a case where buffing is performed as a polishing step after performing sandblasting processing will be described.

First, the placement surface 11a that is the upper surface of the placement plate 11 is subjected to polish processing to be a flat surface, and further cleaned. The cleaning is performed, for example, by degreasing with an organic solvent such as acetone, isopropyl alcohol, and toluene, and then, for example, cleaning with warm water.

Figure 4:
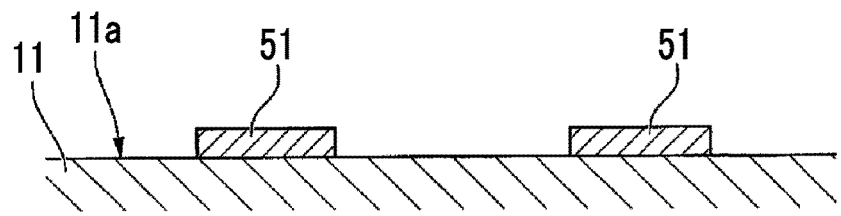
FIG. 4 shows a state in which a mask is formed in a method of forming a convex projection portion of an electrostatic chuck device according to an embodiment of the present invention.

Next, as shown in FIG. 4, a mask 51 having a predetermined pattern is formed on the placement surface 11a. The pattern shape of the mask 51 is the same as a pattern when the convex projection portion 22 and the annular projection portion 21 shown in FIG. 1 are viewed in plan. As the mask 51, a photosensitive resin or a plate-shaped mask is preferably used.

Figure 5:
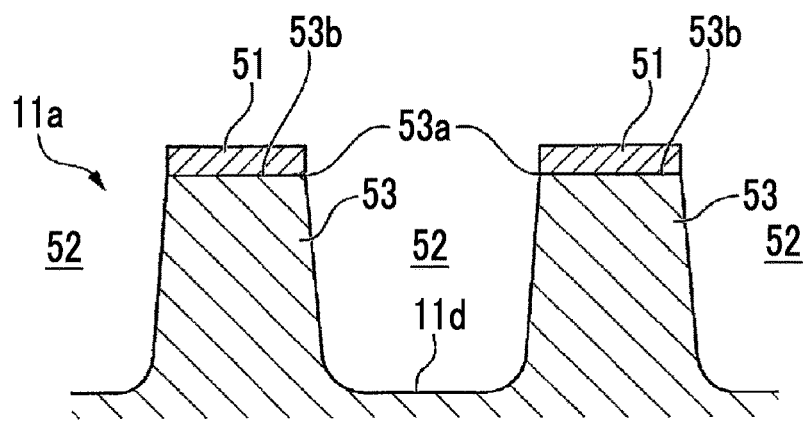
FIG. 5 shows a state after a sandblasting step in the method of forming a convex projection portion of an electrostatic chuck device according to the embodiment of the present invention.

Next, as shown in FIG. 5, sandblasting processing is performed to form a concave portion 52 on a part not covered by the mask 51. As a result, apart covered by the mask 51 remains to form a convex portion 53. The bottom surface 11d is formed between the convex portions 53, and at the bottom of the concave portion 52.

Next, the mask 51 is removed. In a case where the mask 51 is formed of a photosensitive resin, the mask 51 can be removed using, for example, a peeling solution such as methylene chloride.

Next, the entire placement surface 11a is subjected to buffing using fine abrasive particles and buff materials. After the buffing, the placement surface 11a is cleaned. The cleaning is performed by degreasing with, for example, an organic solvent such as acetone. After the degreasing, the cleaning is performed with, for example, warm water.

Figure 6:
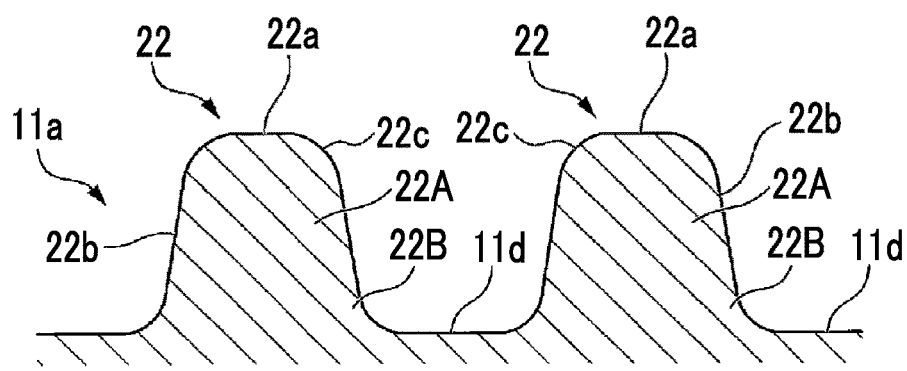
FIG. 6 shows a state after the mask is removed and buffing is performed in the method of forming a convex projection portion of an electrostatic chuck device according to the embodiment of the present invention.

By performing the buffing step, the convex portion 53 of the placement surface 11a becomes the convex projection portion 22 as shown in FIG. 6.

The sandblasting step that is the preceding step is a step of damaging the surface of the placement surface 11a and removing a part where the mask 51 is not formed so as to be excavated. Therefore, a surface crack extending from the surface portion toward the inside remains, in particular, near a corner 53a of the convex portion 53 formed by the sandblasting step. The surface cracks are progressed with a small stress and become a starting point of peeling to cause the particle generation.

By performing the buffing, the surface cracks formed in the sandblasting step are forcibly progressed and peeled, and thus the surface cracks can be removed. The peeling progresses starting from the surface crack, an upper surface 53b and the corner 53a of the convex portion 53 are rounded, and a R surface 22c is formed as shown in FIG. 6.

In addition, the entire convex projection portion 22 including the top surface 22a, and the bottom surface 11d of the placement surface 11a can be polished at the same time by performing the buffing on the entire placement surface 11a. Accordingly, the surface roughness Ra of the top surface 22a is set to 0.05 µm or lower, and the peripheral surface of a columnar portion 22A and a base portion 22B of the convex projection portion 22 and the bottom surface 11d can be a surface roughness according to the surface roughness of the top surface 22a. In the buffing step, the buff material is evenly applied to the top surface 22a, but the bottom surface 11d may have partially roughened surface texture since there is a part where the buff material is difficult to reach. The surface roughness Ra of the bottom surface 11d can be reduced to 0.05 µm or lower by the buffing step including the above described matter.

Conditions for sandblasting processing and conditions for buffing will be described.

Alumina, silicon carbide, glass beads, and the like are preferable as media used for sandblasting processing, and the particle diameter of the media is preferably 400 mesh under (the media passing through 300 mesh).

A discharge pressure of media in the sandblasting processing is preferably, for example, 0.1 MPa or lower, and more preferably 0.05 MPa or lower.

In the sandblasting step of the related art, in consideration of processing efficiency, a particle diameter of the media particle was set to 170 mesh under and the discharge pressure of the media was set to approximately 0.2 MPa.

As compared with the related art, it is preferable that the sand blasting step of the present embodiment is performed with a smaller particle diameter of the media and a suppressed discharge pressure.

By reducing the particle diameter of the media and setting the discharge pressure of the media to 0.1 MPa or lower (more preferably, 0.05 MPa or lower), generation of surface cracks can be suppressed.

The surface cracks are removed in the buffing step. However, in a case where it is considered that a large number of surface cracks are generated, it is necessary to carefully perform the buffing step, and an inclination of the columnar portion 22A becomes large. Therefore, a change in cross-sectional area along the height direction may be large.

By reducing the particle diameter of the media and setting the discharge pressure of the media to 0.1 MPa or lower (more preferably, 0.05 MPa or lower), generation of surface cracks can be suppressed and the buffing step can be simplified. Accordingly, a polishing amount of the convex projection portion 22 in the buffing is reduced. Therefore, the inclination of the columnar portion 22A can be reduced.

That is, an increase rate in the cross-sectional area of the convex projection portion 22 downward from the top surface 22a can be reduced.

It is preferable to use fine abrasive particles having a particle diameter of 0.125 µm or lower as the fine abrasive particles used for the buffing. Accordingly, the polishing step can be performed under softer conditions, and the increase rate in the cross-sectional area of the convex projection portion 22 downward from the top surface 22a can be reduced. The buff material is not particularly limited, and for example, a resin buff material can be used.

In the buffing, it is preferable that the polishing is performed in multiple steps by using finer abrasive particles at each step. For example, it is preferable to perform multiple step polishing by performing the buffing in order of fine abrasive particles of 800 mesh, fine abrasive particles of 1000 mesh, and fine abrasive particles of 1500 mesh.

Next, the surface protection tape is removed from the laminate including the electrostatic chuck portion 2, the adhesive layer 4, and the cooling base portion 3.

Next, particles remaining on the convex surface 23 of the electrostatic chuck portion 2 and the placement surface 11a of the placement plate 11 (processing waste of the placement plate 11) are removed by ultrasonic cleaning in ultrapure water. Furthermore, after removing the adhesive remaining on the side surface and the back surface of the laminate by wiping with alcohol, the laminate is dried by a dryer.

As described above, obtained is the electrostatic chuck device 1 of the present embodiment in which the electrostatic chuck portion 2 and the cooling base portion 3 are bonded and integrated via the adhesive layer 4, the annular projection portion 21 and the plurality of convex projection portions 22 are formed on the placement surface 11a of the placement plate 11 of the electrostatic chuck portion 2, and the cross-sectional shape of the placement plate 11 in the thickness direction is a curved shape that curves in such a manner that a height with reference to the one main surface 3a of the cooling base portion 3 gradually increases from the center 23a of the convex surface or concave surface 23 toward the outer periphery 23b of the convex surface or concave surface 23.

According to the method of manufacturing the electrostatic chuck device of the present embodiment, obtained is the electrostatic chuck device 1 in which even though the plate-shaped sample W is repeatedly placed on the placement surface 11a of the placement plate 11 and the top surface 22a of the convex projection portion 22 is worn, a change in the contact area between the top surface 22a of the convex projection portion 22 and the plate-shaped sample W is small and wear resistance is excellent. Therefore, in the electrostatic chuck device 1, the plate-shaped sample W can be attracted and fixed to the placement surface 11a of the placement plate 11 in a state where the plate-shaped sample W comes into close contact with the placement surface 11a of the placement plate 11 and the temperature of the plate-shaped sample W can be stably controlled to be uniform.

EXAMPLES

Hereinafter, the present invention will be described more specifically with reference to Examples and Comparative Examples, but the present invention is not limited to the following Examples.

Example 1A

The electrostatic chuck device 1 as shown in FIG. 1A and FIGS. 2 to 6 was manufactured.

First, the electrostatic chuck portion 2 in which the convex projection portion 22 was not formed on the placement surface 11a of the placement plate 11 was manufactured by a method in the related art.

The internal electrode for electrostatic attraction 13 having a thickness of about 10 μm is embedded in the electrostatic chuck portion 2. The placement plate 11 of the electrostatic chuck portion 2 was an aluminum oxide-silicon carbide composite sintered compact containing 7.8% by mass of silicon carbide, and was a disk having a diameter of 298 mm and a thickness of 0.5 mm.

The supporting plate 12 was also an aluminum oxide-silicon carbide composite sintered compact containing 7.8% by mass of silicon carbide, the same as the placement plate 11, and was a disk having a diameter of 298 mm and a thickness of 2 mm. The placement plate 11 and the supporting plate 12 were bonded to and integrated with each other, so that the entire thickness of the electrostatic chuck portion 2 was 2.5 mm.

Next, the placement surface 11a that is the upper surface of the placement plate 11 was subjected to polish processing to be the convex surface or concave surface 23, and further cleaned.

Next, the mask 51 corresponding to the shapes of the convex projection portion 22 and the annular projection portion 21 was formed on the placement surface 11a (see FIG. 4).

Next, sandblasting processing was performed to form the convex portion 53 and the concave portion 52 (see FIG. 5).

Next, the mask 51 was removed (see FIG. 6).

Next, the entire placement surface 11a was subjected to buffing using fine abrasive particles and buff materials.

Next, the placement surface 11a was degreased with acetone and then cleaned with warm water.

Through the above steps, about 10,000 convex projection portions 22 were formed on the placement surface 11a, and the electrostatic chuck portion 2 of Example 1A was obtained.

Regarding the obtained electrostatic chuck portion 2, the difference (in Table 1, "height difference Δh") between the height of the top surface 22a of the convex projection portion 22 positioned at the center 11b of the placement surface 11a and the height of the upper surface 21a of the annular projection portion 21 was measured. The difference in height was measured by a surface roughness and contour complex measuring instrument (trade name: SURFCOM NEX, manufactured by TOKYO SEIMITSU CO., LTD.). The results are shown in Table 1.

Regarding the obtained electrostatic chuck portion 2, the ratio (shown as "$d_2/d_1$" in Table 1) of the diameter $d_2$ of the top surface 22a of the convex projection portion 22 to the diameter $d_1$ of the bottom surface 22d of the convex projection portion 22 was measured. The diameter $d_1$ and the diameter $d_2$ were calculated based on the measurement results obtained by a surface roughness and contour complex measuring instrument (trade name: SURFCOM NEX, manufactured by TOKYO SEIMITSU CO., LTD.). The results are shown in Table 1.

In the placement surface 11a, the inner peripheral portion on the placement surface 11a of the placement plate 11 was defined as a region from the center 11b of the placement surface 11a to 55% or higher and 65% or lower of a radius of the placement surface 11a. In addition, in the placement surface 11a of the placement plate 11, the outer peripheral portion on the placement surface 11a of the placement plate 11 was defined as a region outside the inner peripheral portion.

Regarding the obtained electrostatic chuck portion 2, the angle θ (shown as "Angle θ" in Table 1) formed by the top surface 22a and the side surface 22b of the convex projection portion 22 and the R surface 22c were obtained by analyzing the measurement results obtained by a surface roughness and contour complex measuring instrument (trade name: SURFCOM NEX, manufactured by TOKYO SEIMITSU CO., LTD.). The results are shown in Table 1.

Regarding the obtained electrostatic chuck portion 2, a center line average surface roughness Ra (shown as "center line average surface roughness Ra1" in Table 1) of the top surface 22a of the convex projection portion 22 and a center line average surface roughness Ra (shown as "center line average surface roughness Ra2" in Table 1) of the upper surface 21a of the annular projection portion 21 were measured. The center line average surface roughness Ra of the top surface 22a of the convex projection portion 22 and the center line average surface roughness Ra of the upper surface 21a of the annular projection portion 21 were measured using a surface roughness and contour complex measuring instrument (trade name: SURFCOM NEX, manufactured by TOKYO SEIMITSU CO., LTD.), according to JIS B 0601. The results are shown in Table 1.

Regarding the obtained electrostatic chuck portion 2, the diameter $d_2$ (shown as "diameter d" in Table 1,) of the top surface 22a of the convex projection portion 22 was measured. The diameter $d_2$ of the top surface 22a of the convex projection portion 22 was measured by a surface roughness and contour complex measuring instrument (trade name: SURFCOM NEX, manufactured by TOKYO SEIMITSU CO., LTD.). The results are shown in Table 1.

Regarding the electrostatic chuck portion 2, a ratio A1 of a total contact area between the convex projection portions 22 positioned on the inner peripheral portion on the placement surface 11a of the placement plate 11 and the plate-shaped sample W to a total area of the inner peripheral portion on the placement surface 11a of the placement plate 11, a ratio B1 of a total contact area between the convex projection portions 22 positioned on the outer peripheral portion on the placement surface 11a of the placement plate 11 and the plate-shaped sample W to a total area of the outer peripheral portion on the placement surface 11a of the placement plate 11, and when including an intermediate portion, a ratio C1 of a total contact area between the convex projection portions 22 positioned on the intermediate portion on the placement surface 11a of the placement plate 11 and the plate-shaped sample W to a total area of the intermediate portion on the placement surface 11a of the placement plate 11 were calculated from the measurement results obtained by a surface roughness and contour complex measuring instrument (trade name: SURFCOM NEX, manufactured by TOKYO SEIMITSU CO., LTD.). The results are shown in Table 1.

Regarding the electrostatic chuck portion 2, a total contact area A1 between the convex projection portions 22 positioned on the outer peripheral portion on the placement surface 11a of the placement plate 11 and the plate-shaped sample W and a total contact area A1 between the convex projection portions 22 positioned on the inner peripheral portion on the placement surface 11a of the placement plate 11 and the plate-shaped sample W were calculated from the measurement results of the diameter $d_2$ of the top surface 22a of the convex projection portion 22 obtained by a surface roughness and contour complex measuring instrument (trade name: SURFCOM NEX, manufactured by TOKYO SEIMITSU CO., LTD.). A ratio (A1/B1) of the total contact area is shown in Table 1.

[Evaluation]

"Evaluation of Change in in-Plane Temperature of Wafer Surface Over Time"

The electrostatic chuck device 1 having the electrostatic chuck portion 2 obtained in Example 1A was mounted on a semiconductor manufacturing apparatus, and using infrared thermography, a difference between maximum and minimum values of initial in-plane temperature distribution is compared to a difference between maximum and minimum values of in-plane temperature distribution after processing 1000 plate-shaped samples W. In Example 1A, the difference between maximum and minimum values of initial in-plane temperature distribution (hereinafter, referred to as "initial temperature range") of the plate-shaped sample W was 2.6° C.

A case where the difference compared to the initial temperature range was lower than 3° C. was evaluated as "A", a case where the difference compared to the initial temperature range was 3° C. or higher and lower than 4° C. was evaluated as "B", a case where the difference compared to the initial temperature range was 4° C. or higher and lower than 5° C. was evaluated as "C", and a case where the difference compared to the initial temperature range was 5° C. or higher was evaluated as "D".

Example 2a

The electrostatic chuck device 1 of Example 2 as shown in FIG. 1A, and FIGS. 2 to 4 was manufactured in the same manner as in Example 1A, except that the ratio $d_2/d_1$ of the top surface $d_2$ to the bottom surface $d_1$ of the convex projection portion was set to 0.80 and a ratio A1/B1 of a total contact area A1 between the convex projection portions 22 positioned on the inner peripheral portion on the placement surface 11a of the placement plate 11 and the plate-shaped sample W to a total contact area B1 between the convex projection portions 22 positioned on the outer peripheral portion on the placement surface 11a of the placement plate 11 and the plate-shaped sample W was set to 1.6.

Regarding the obtained electrostatic chuck portion 2, the dimension and the like of each part were measured in the same manner as in Example 1A. The results are shown in Table 1.

In addition, regarding the obtained electrostatic chuck device 1, a change in in-plane temperature of the plate-shaped sample W was measured in the same manner as in Example 1A. The initial temperature range was 2.8° C. The results are shown in Table 1.

Example 3a

The electrostatic chuck device 1 of Example 3A as shown in FIG. 1A, and FIGS. 2 to 4 was manufactured in the same manner as in Example 1A, except that an intermediate portion on the placement surface 11a of the placement plate 11 was included, the inner peripheral portion on the placement surface 11a of the placement plate 11 was defined as a region from the center 11b of the placement surface 11a to 30% or higher and lower than 40% of a radius of the placement surface 11a, in the placement surface 11a, the intermediate portion on the placement surface 11a of the placement plate 11 was defined as a region with 55% or higher and lower than 65% of the radius of the placement surface 11a outside the inner peripheral portion, the outer peripheral portion on the placement surface 11a of the placement plate 11 was defined as a region outer than the intermediate portion, the ratio $d_2/d_1$ of the top surface $d_2$ to the bottom surface $d_1$ of the convex projection portion was set to 0.80, when a total contact area between the convex projection portions 22 positioned on the intermediate portion of the placement surface 11a of the placement plate 11 and the plate-shaped sample W was denoted by C1, a ratio A1/C1 of the total contact area A1 on the inner peripheral portion to the total contact area C1 on the intermediate portion was set to 2.6, and a ratio C1/B1 of the total contact area C1 on the intermediate portion to the total contact area B1 on the outer peripheral portion was set to 4.2.

Regarding the obtained electrostatic chuck portion 2, the dimension and the like of each part were measured in the same manner as in Example 1A. The results are shown in Table 1. The initial temperature range was 2.8° C.

In addition, regarding the obtained electrostatic chuck device 1, a change in in-plane temperature of the plate-shaped sample W was measured in the same manner as in Example 1A. The results are shown in Table 1.

Comparative Example 1a

The electrostatic chuck device 1 of Example 3A as shown in FIG. 1A, and FIGS. 2 to 4 was manufactured in the same manner as in Example 1A, except that the ratio $d_2/d_1$ of the top surface $d_2$ to the bottom surface $d_1$ of the convex projection portion was set to 0.55, A1/B1 was set to 5.8, the angle θ formed by the top surface 22a and the side surface 22b was higher than 170°, and the radius of curvature of the R surface was set to 80 μm.

Regarding the obtained electrostatic chuck portion 2, the dimension and the like of each part were measured in the same manner as in Example 1A. The results are shown in Table 1. The initial temperature range was 2.7° C.

In addition, regarding the obtained electrostatic chuck device 1, a change in in-plane temperature of the plate-shaped sample W was measured in the same manner as in Example 1A. The results are shown in Table 1.

TABLE 1

| | Δh (μm) | h1 (μm) | Curvature of R surface | $d_2/d_1$ | Angle θ | Ra1 (μm) | Ra2 (μm) | A1/B1 | C1/B1 | A1/C1 | Temperature uniformity |
|---|---|---|---|---|---|---|---|---|---|---|---|
| Example 1A | 10 | 15 | 25 | 0.85 | 103 | 0.013 | 0.013 | 5.7 | | | B |
| Example 2A | 10 | 15 | 25 | 0.80 | 102 | 0.013 | 0.014 | 1.6 | | | C |
| Example 3A | 10 | 15 | 25 | 0.80 | 101 | 0.013 | 0.015 | | 4.2 | 2.6 | A |
| Comparative Example 1A | 10 | 15 | 80 | 0.55 | 172 | 0.013 | 0.013 | 5.8 | | | D |

From the results shown in Table 1, it was confirmed that even though the plate-shaped sample W was repeatedly placed on the placement surface 11a of the placement plate 11, in-plane temperature uniformity of the plate-shaped sample W in the electrostatic chuck device 1 of Example 1A to Example 3A was improved compared to the electrostatic chuck device 1 of Comparative Example. By setting the angle θ formed by the top surface 22a and the side surface 22b to 90° or higher and 160° or lower, increasing the ratio of the top surface $d_2$ of the convex projection portion to the bottom surface $d_1$ to 0.75 or higher, and reducing the radius of curvature of the R surface 22c, it was confirmed that a change in the contact area with the plate-shaped sample W was small even though the top surface 22a of the convex projection portion 22 was worn, the plate-shaped sample W could be attracted and fixed to the placement surface 11a of the placement plate 11 in a state where the plate-shaped sample W comes into close contact with the placement surface 11a of the placement plate 11, and the temperature of the plate-shaped sample W could be stably controlled to be uniform. In addition, from Example 1A and Example 2A, it was confirmed that in a case where a ratio A1/B1 of the ratio B1 of the total contact area to the total area of the outer peripheral portion of the plate-shaped sample W to the ratio A1 of the total contact area to the total area of the inner peripheral portion is higher than 2, in-plane temperature uniformity of the plate-shaped sample W after the long-term use was improved. Furthermore, it was confirmed that in a case where the intermediate portion was provided between the inner peripheral portion and the outer peripheral portion, the change in the in-plane temperature uniformity of the plate-shaped sample W after the long-term use was small.

Example 1B

The electrostatic chuck device 1 as shown in FIG. 1B and FIGS. 2 to 6 was manufactured.

First, the electrostatic chuck portion 2 in which the convex projection portion 22 was not formed on the placement surface 11a of the placement plate 11 was manufactured by a method in the related art.

The internal electrode for electrostatic attraction 13 having a thickness of about 10 μm is embedded in the electrostatic chuck portion 2. The placement plate 11 of the electrostatic chuck portion 2 was an aluminum oxide-silicon carbide composite sintered compact containing 7.8% by mass of silicon carbide, and was a disk having a diameter of 298 mm and a thickness of 0.5 mm.

The supporting plate 12 was also an aluminum oxide-silicon carbide composite sintered compact containing 7.8% by mass of silicon carbide, the same as the placement plate 11, and was a disk having a diameter of 298 mm and a thickness of 2 mm. The placement plate 11 and the supporting plate 12 were bonded to and integrated with each other, so that the entire thickness of the electrostatic chuck portion 2 was 2.5 mm.

Next, the placement surface 11a that is the upper surface of the placement plate 11 was subjected to polish processing to be the convex surface or concave surface 23, and further cleaned.

Next, the mask 51 corresponding to the shapes of the convex projection portion 22 and the annular projection portion 21 was formed on the placement surface 11a (see FIG. 4).

Next, sandblasting processing was performed to form the convex portion 53 and the concave portion 52 (see FIG. 5).

Next, the mask 51 was removed (see FIG. 6).

Next, the entire placement surface 11a was subjected to buffing using fine abrasive particles and buff materials.

Next, the placement surface 11a was degreased with acetone and then cleaned with warm water.

Through the above steps, about 10,000 convex projection portions 22 were formed on the placement surface 11a, and the electrostatic chuck portion 2 of Example 1B was obtained.

Regarding the obtained electrostatic chuck portion 2, the difference (in Table 1, "height difference Δh") between the height of the top surface 22a of the convex projection portion 22 positioned at the center 11b of the placement surface 11a and the height of the upper surface 21a of the annular projection portion 21 was measured. The difference in height was measured by a surface roughness and contour complex measuring instrument (trade name: SURFCOM NEX, manufactured by TOKYO SEIMITSU CO., LTD.). The results are shown in Table 2.

Regarding the obtained electrostatic chuck portion 2, the ratio (shown as "$d_2/d_1$" in Table 1) of the diameter $d_2$ of the top surface 22a of the convex projection portion 22 to the diameter $d_1$ of the bottom surface 22d of the convex projection portion 22 was measured. The diameter $d_1$ and the diameter $d_2$ were calculated based on the measurement results obtained by a surface roughness and contour complex measuring instrument (trade name: SURFCOM NEX, manufactured by TOKYO SEIMITSU CO., LTD.). The results are shown in Table 1.

In the placement surface 11a, the inner peripheral portion on the placement surface 11a of the placement plate 11 was defined as a region from the center 11b of the placement surface 11a to 55% or higher and 65% or lower of a radius of the placement surface 11a. In addition, in the placement surface 11a of the placement plate 11, the outer peripheral portion on the placement surface 11a of the placement plate 11 was defined as a region outside the inner peripheral portion.

Regarding the obtained electrostatic chuck portion 2, the angle θ (shown as "Angle θ" in Table 1) formed by the top surface 22a and the side surface 22b of the convex projection portion 22 and the R surface 22c were obtained by analyzing the measurement results obtained by a surface roughness and contour complex measuring instrument (trade name: SURFCOM NEX, manufactured by TOKYO SEIMITSU CO., LTD.). The results are shown in Table 2.

Regarding the obtained electrostatic chuck portion 2, a center line average surface roughness Ra (shown as "center line average surface roughness Ra1" in Table 2) of the top surface 22a of the convex projection portion 22 and a center line average surface roughness Ra (shown as "center line average surface roughness Ra2" in Table 2) of the upper surface 21a of the annular projection portion 21 were measured. The center line average surface roughness Ra of the top surface 22a of the convex projection portion 22 and the center line average surface roughness Ra of the upper surface 21a of the annular projection portion 21 were measured using a surface roughness and contour complex measuring instrument (trade name: SURFCOM NEX, manufactured by TOKYO SEIMITSU CO., LTD.), according to JIS B 0601. The results are shown in Table 2.

Regarding the obtained electrostatic chuck portion 2, the diameter $d_2$ (shown as "diameter d" in Table of the top surface 22a of the convex projection portion 22 was measured. The diameter $d_2$ of the top surface 22a of the convex projection portion 22 was measured by a surface roughness and contour complex measuring instrument (trade name: SURFCOM NEX, manufactured by TOKYO SEIMITSU CO., LTD.). The results are shown in Table 2.

Regarding the electrostatic chuck portion 2, a total contact area B22 between the convex projection portions 22 positioned on the outer peripheral portion on the placement surface 11a of the placement plate 11 and the plate-shaped sample W and a total contact area A22 between the convex projection portions 22 positioned on the inner peripheral portion on the placement surface 11a of the placement plate 11 and the plate-shaped sample W were calculated from the measurement results of the diameter $d_2$ of the top surface 22a of the convex projection portion 22 obtained by a surface roughness and contour complex measuring instrument (trade name: SURFCOM NEX, manufactured by TOKYO SEIMITSU CO., LTD.). A ratio (B22/A22) of the total contact area is shown in Table 2.

[Evaluation]

"Evaluation of Change in in-Plane Temperature of Wafer Surface Over Time"

The electrostatic chuck device 1 having the electrostatic chuck portion 2 obtained in Example 1B was mounted on a semiconductor manufacturing apparatus, and using infrared thermography, a difference between maximum and minimum values of initial in-plane temperature distribution is compared to a difference between maximum and minimum values of in-plane temperature distribution after processing 1000 plate-shaped samples W. In Example 1B, the difference between maximum and minimum values of initial in-plane temperature distribution (hereinafter, referred to as "initial temperature range") of the plate-shaped sample W was 2.8° C.

A case where the difference compared to the initial temperature range was lower than 3° C. was evaluated as "A", a case where the difference compared to the initial temperature range was 3° C. or higher and lower than 4° C. was evaluated as "B", a case where the difference compared to the initial temperature range was 4° C. or higher and lower than 5° C. was evaluated as "C", and a case where the difference compared to the initial temperature range was 5° C. or higher was evaluated as "D".

Example 2B

The electrostatic chuck device 1 of Example 2B as shown in FIG. 1B, and FIGS. 2 to 4 was manufactured in the same manner as in Example 1, except that the ratio $d_2/d_1$ of the top surface $d_2$ to the bottom surface $d_1$ of the convex projection portion was set to 0.80 and a ratio B22/A22 of the total contact area B22 between the convex projection portions 22 positioned on the outer peripheral portion on the placement surface 11a of the placement plate 11 and the plate-shaped sample W to the total contact area A22 between the convex projection portions 22 positioned on the inner peripheral portion on the placement surface 11a of the placement plate 11 and the plate-shaped sample W was set to 1.7.

Regarding the obtained electrostatic chuck portion 2, the dimension and the like of each part were measured in the same manner as in Example 1B. The results are shown in Table 2.

In addition, regarding the obtained electrostatic chuck device 1, a change in in-plane temperature of the plate-shaped sample W was measured in the same manner as in Example 1B. The initial temperature range was 2.6° C. The results are shown in Table 2.

Example 3B

The electrostatic chuck device 1 of Example 3B as shown in FIG. 1B, and FIGS. 2 to 4 was manufactured in the same manner as in Example 1B, except that an intermediate portion on the placement surface 11a of the placement plate 11 was included, the inner peripheral portion on the placement surface 11a of the placement plate 11 was defined as a region from the center 11b of the placement surface 11a to 30% or higher and lower than 40% of a radius of the placement surface 11a, in the placement surface 11a, the intermediate portion on the placement surface 11a of the placement plate 11 was defined as a region with 55% or higher and lower than 65% of the radius of the placement surface 11a outside the inner peripheral portion, the outer peripheral portion on the placement surface 11a of the placement plate 11 was defined as a region outer than the intermediate portion, the ratio $d_2/d_1$ of the top surface $d_2$ to the bottom surface $d_1$ of the convex projection portion was set to 0.80, when a total contact area between the convex projection portions 22 positioned on the intermediate portion of the placement surface 11a of the placement plate 11 and the plate-shaped sample W was denoted by C22, a ratio C22/A22 of the total contact area A22 on the inner peripheral portion to the total contact area C22 on the intermediate portion was set to 2.1, and a ratio B22/C22 of the total contact area C22 on the intermediate portion to the total contact area B22 on the outer peripheral portion was set to 5.0.

Regarding the obtained electrostatic chuck portion 2, the dimension and the like of each part were measured in the same manner as in Example 1B. The results are shown in Table 2. The initial temperature range was 2.7° C.

In addition, regarding the obtained electrostatic chuck device 1, a change in in-plane temperature of the plate-shaped sample W was measured in the same manner as in Example 1B. The results are shown in Table 2.

Comparative Example 1B

The electrostatic chuck device 1 of Comparative Example as shown in FIG. 1B, and FIGS. 2 to 4 was manufactured in the same manner as in Example 1, except that the ratio $d_2/d_1$ of the top surface $d_2$ to the bottom surface $d_1$ of the convex projection portion was set to 0.55, B22/A22 was set to 5.9, the angle θ formed by the top surface 22a and the side surface 22b was higher than 170°, and the radius of curvature of the R surface was set to 80 μm.

Regarding the obtained electrostatic chuck portion 2, the dimension and the like of each part were measured in the same manner as in Example 1B. The results are shown in Table 2. The initial temperature range was 2.7° C.

In addition, regarding the obtained electrostatic chuck device 1, a change in in-plane temperature of the plate-shaped sample W was measured in the same manner as in Example 1B. The results are shown in Table 2.

TABLE 2

|  | Δh (μm) | h1 (μm) | Curvature of R surface | $d_2/d_1$ | Angle θ | Ra1 (μm) | Ra2 (μm) | B22/A22 | B22/C22 | C22/A22 | Temperature uniformity |
|---|---|---|---|---|---|---|---|---|---|---|---|
| Example 1B | 10 | 15 | 25 | 0.85 | 101 | 0.014 | 0.013 | 6.8 |  |  | B |
| Example 2B | 10 | 15 | 25 | 0.80 | 103 | 0.015 | 0.014 | 1.7 |  |  | C |
| Example 3B | 10 | 15 | 25 | 0.80 | 102 | 0.013 | 0.014 |  | 5.0 | 2.1 | A |

TABLE 2-continued

|  | Δh (μm) | h1 (μm) | Curvature of R surface | $d_2/d_1$ | Angle θ | Ra1 (μm) | Ra2 (μm) | B22/ A22 | B22/ C22 | C22/ A22 | Temperature uniformity |
|---|---|---|---|---|---|---|---|---|---|---|---|
| Comparative Example 1B | 10 | 15 | 80 | 0.55 | 173 | 0.014 | 0.013 | 5.9 |  |  | D |

From the results shown in Table 2, in the electrostatic chuck device 1 of Example 1B to Example 3B, even though the plate-shaped sample W was repeatedly placed on the placement surface 11a of the placement plate 11, the top surface 22a of the convex projection portion 22 was less worn and wear resistance was more excellent than the electrostatic chuck device 1 of the Comparative Example 1B. Therefore, it was confirmed that the plate-shaped sample W could be attracted and fixed to the placement surface 11a of the placement plate 11 in a state where the plate-shaped sample W comes into close contact with the placement surface 11a of the placement plate 11 and the temperature of the plate-shaped sample W could be stably controlled to be uniform.

INDUSTRIAL APPLICABILITY

The electrostatic chuck device according to the present invention is preferably used for a semiconductor manufacturing apparatus for manufacturing semiconductors such as ICs, LSIs, VLSIs, and the like, and used to attract and fix a plate-shaped sample such as a semiconductor wafer by electrostatic force and to perform various types of treatment such as film formation treatment, etching treatment, and exposure treatment on this plate-shaped sample.

REFERENCE SIGNS LIST

1: electrostatic chuck device
2: electrostatic chuck portion
3: cooling base portion
4: adhesive layer
11: placement plate (base body)
12: supporting plate
13: internal electrode for electrostatic attraction
14: insulating material layer
15: power supply terminal
21: annular projection portion
22: convex projection portion
23: convex surface
51: mask
52: concave portion
53: convex portion

The invention claimed is:

1. An electrostatic chuck device for electrostatically attracting a plate-shaped sample to one main surface of a base body thereof,
wherein a cross-sectional shape of the base body in a thickness direction is a convex curved surface or a concave curved surface that gradually curves from a center of the one main surface toward an outer periphery of the one main surface,
an annular projection portion having a square vertical cross-section is provided on a peripheral portion on the one main surface so as to go around the peripheral portion,
a plurality of convex projection portions having a circular transverse cross-section or a polygonal transverse cross-section and a square vertical cross-section are provided in a region surrounded by the annular projection portion on the one main surface,
a difference between a height of a top surface of the convex projection portion positioned at a center of the one main surface and a height of an upper surface of the annular projection portion is 1 μm or higher and 30 μm or lower,
the convex projection portion has the top surface coming into contact with the plate-shaped sample, a side surface, and an R surface continuously connecting the top surface and the side surface, and a ratio of a diameter of the top surface to a diameter of a bottom surface of the portion is 0.75 or higher, and
an angle formed by the top surface and the side surface of the convex projection portion is 90° or higher and 160° or lower.

2. The electrostatic chuck device according to claim 1, wherein a center line average surface roughness Ra of the top surface of the convex projection portion is 0.05 μm or lower.

3. The electrostatic chuck device according to claim 1, wherein a center line average surface roughness Ra of the upper surface of the annular projection portion is 0.05 μm or lower.

4. The electrostatic chuck device according to claim 1, wherein the diameter of the top surface of the convex projection portion is 100 μm or higher and 1000 μm or lower.

5. The electrostatic chuck device according to claim 1, wherein the cross-sectional shape of the base body in the thickness direction is the convex curved surface that gradually curves from the center of the one main surface toward the outer periphery of the one main surface, and
a ratio of a diameter of the top surface of the convex projection portion positioned on an inner peripheral portion on the one main surface to a diameter of the bottom surface thereof is greater than a ratio of a diameter of the top surface of the convex projection portion positioned on an outer peripheral portion on the one main surface to a diameter of a bottom surface thereof.

6. The electrostatic chuck device according to claim 5, wherein a ratio A1 of a total contact area between the convex projection portions positioned on the inner peripheral portion and the plate-shaped sample to a total area of the inner peripheral portion is greater than a ratio B1 of a total contact area between the convex projection portion positioned on the outer peripheral portion and the plate-shaped sample to a total area of the outer peripheral portion.

7. The electrostatic chuck device according to claim 6, wherein
an intermediate portion is provided between the outer peripheral portion and the inner peripheral portion, and
a diameter of the bottom surface of the convex projection portion positioned on the intermediate portion is greater than a diameter of the bottom surface of the convex projection portion positioned on the outer peripheral portion and smaller than a diameter of the bottom surface of the convex projection portion positioned on the inner peripheral portion.

8. The electrostatic chuck device according to claim 6, wherein
the ratio A1, the ratio B1, and a ratio C1 of a total contact area between the convex projection portions positioned on the intermediate portion and the plate-shaped sample to a total area of the intermediate portion satisfy the following Expression (1)

$$A1>C1>B1 \qquad (1).$$

9. The electrostatic chuck device according to claim 1, wherein the cross-sectional shape of the base body in a thickness direction is the concave curved surface that gradually curves from a center of the one main surface toward the outer periphery of the one main surface, and
a ratio of a diameter of the top surface of the convex projection portion positioned on an outer peripheral portion on the one main surface to a diameter of the bottom surface thereof is greater than a ratio of a diameter of the top surface of the convex projection portion positioned on an inner peripheral portion on the one main surface to a diameter of the bottom surface thereof.

10. The electrostatic chuck device according to claim 9, wherein a total B22 of a contact area between the convex projection portions positioned on the outer peripheral portion and the plate-shaped sample is greater than a total A22 of a contact area between the convex projection portion positioned on the inner peripheral portion and the plate-shaped sample.

11. The electrostatic chuck device according to claim 10, wherein
an intermediate portion is provided between the outer peripheral portion and the inner peripheral portion, and
a diameter of the bottom surface of the convex projection portion positioned on the intermediate portion is greater than a diameter of the bottom surface of the convex projection portion positioned on the inner peripheral portion and smaller than a diameter of the bottom surface of the convex projection portion positioned on the outer peripheral portion.

12. The electrostatic chuck device according to claim 10, wherein
the total A22, the total B22, and a total C22 of a contact area between the convex projection portions positioned on the intermediate portion and the plate-shaped sample satisfy the following Expression (2), $$B22>C22>A22 \qquad (2).$$

13. The electrostatic chuck device according to claim 1, wherein the one main surface is made of an aluminum oxide-silicon carbide composite sintered compact, an aluminum oxide sintered compact, an aluminum nitride sintered compact, or an yttrium oxide sintered compact.

* * * * *